US008894770B2

(12) United States Patent
Carlisle

(10) Patent No.: US 8,894,770 B2
(45) Date of Patent: Nov. 25, 2014

(54) PROCESS AND APPARATUS TO TREAT METAL SURFACES

(71) Applicant: Andritz Iggesund Tools Inc., Glens Falls, NY (US)

(72) Inventor: Jennings Drake Carlisle, Clearwater, FL (US)

(73) Assignee: Andritz Iggesund Tools Inc., Oldsmar, FL (US)

( * ) Notice: Subject to any disclaimer, the term of this patent is extended or adjusted under 35 U.S.C. 154(b) by 0 days.

(21) Appl. No.: 13/795,870

(22) Filed: Mar. 12, 2013

(65) Prior Publication Data

US 2013/0243955 A1 Sep. 19, 2013

Related U.S. Application Data

(60) Provisional application No. 61/610,883, filed on Mar. 14, 2012, provisional application No. 61/610,894, filed on Mar. 14, 2012.

(51) Int. Cl.
| | |
|---|---|
| C23C 8/70 | (2006.01) |
| C23C 8/68 | (2006.01) |
| C23C 8/60 | (2006.01) |
| C23C 10/28 | (2006.01) |
| C23C 8/04 | (2006.01) |
| C23C 16/38 | (2006.01) |
| C23C 16/448 | (2006.01) |
| B27L 11/02 | (2006.01) |
| C23C 8/10 | (2006.01) |
| C23C 28/00 | (2006.01) |
| C23C 8/36 | (2006.01) |
| B26D 1/00 | (2006.01) |

(52) U.S. Cl.
CPC ............... *C23C 16/38* (2013.01); *B27L 11/02* (2013.01); *C23C 8/10* (2013.01); *C23C 8/60* (2013.01); *C23C 8/70* (2013.01); *C23C 16/448* (2013.01); *C23C 28/322* (2013.01); *C23C 28/345* (2013.01); *C23C 8/36* (2013.01); *C23C 10/28* (2013.01); *C23C 8/68* (2013.01); *B26D 1/0006* (2013.01); *B26D 2001/002* (2013.01)
USPC ..................... 118/726; 118/715; 118/720

(58) Field of Classification Search
None
See application file for complete search history.

(56) References Cited

U.S. PATENT DOCUMENTS

| | | | | |
|---|---|---|---|---|
| 2,121,589 A | * | 6/1938 | Espe | 313/346 DC |
| 2,268,691 A | * | 1/1942 | Brooke | 373/110 |

(Continued)

FOREIGN PATENT DOCUMENTS

| | | |
|---|---|---|
| DE | 19822935 C2 | 11/1999 |
| EP | 0387536 A1 | 9/1993 |

(Continued)

OTHER PUBLICATIONS

R.M. Mohanty et al., "Multiphase Formation of Boron Carbide in B2O3—Mg—C Based Micropyretic Process," Journal of Alloys and Compounds 441 (2007) 85-93.*

(Continued)

*Primary Examiner* — Jeffrie R Lund
*Assistant Examiner* — Stanislav Antolin
(74) *Attorney, Agent, or Firm* — Kerri Hochgesang; Robert Joseph Hornung

(57) ABSTRACT

A method for treating metal parts is provided that includes positioning a metal part within a reactor chamber, and positioning a boron containing solid form having a porosity of at least 10% by volume in the reactor chamber adjacent to the metal part. A halide containing gas may be introduced to the reactor chamber that the boron containing solid form is present in. The at least one halide containing gas and the boron containing form react to provide a gas that borides the metal part.

19 Claims, 5 Drawing Sheets

(56) References Cited

U.S. PATENT DOCUMENTS

| | | | |
|---|---|---|---|
| 2,910,382 A * | 10/1959 | Vulliez | 428/615 |
| 3,029,162 A * | 4/1962 | Samuel et al. | 148/279 |
| 3,470,030 A * | 9/1969 | Karlsson et al. | 29/623.1 |
| 3,477,827 A * | 11/1969 | Mott | 422/199 |
| 3,673,005 A * | 6/1972 | Kunst | 148/279 |
| 3,809,583 A * | 5/1974 | Krzyminski et al. | 148/279 |
| 3,985,917 A * | 10/1976 | Krukonis | 427/589 |
| 4,011,107 A * | 3/1977 | Hayes | 148/279 |
| 4,106,382 A | 8/1978 | Salje et al. | |
| 4,188,242 A | 2/1980 | Scales | |
| 4,192,983 A * | 3/1980 | Paoletti | 219/76.1 |
| 4,239,819 A * | 12/1980 | Holzl | 427/255.39 |
| 4,348,980 A * | 9/1982 | Thevenot et al. | 118/717 |
| 4,404,045 A | 9/1983 | Thevenot | |
| 4,536,224 A * | 8/1985 | Beyer et al. | 148/242 |
| 4,605,343 A | 8/1986 | Hibbs, Jr. et al. | |
| 4,629,661 A * | 12/1986 | Hillert et al. | 428/698 |
| 4,637,837 A | 1/1987 | von Matuschka et al. | |
| 4,890,574 A | 1/1990 | Sarin | |
| 5,068,871 A * | 11/1991 | Uchida et al. | 373/17 |
| 5,279,737 A * | 1/1994 | Sekhar et al. | 210/490 |
| 5,296,416 A * | 3/1994 | Park et al. | 501/80 |
| 5,308,399 A * | 5/1994 | Pillhoefer et al. | 118/719 |
| 5,437,832 A * | 8/1995 | Imamura et al. | 419/2 |
| 5,439,525 A * | 8/1995 | Peichl et al. | 118/726 |
| 5,441,762 A * | 8/1995 | Gray et al. | 427/190 |
| 5,455,068 A | 10/1995 | Aves | |
| 5,558,760 A * | 9/1996 | Sekhar | 210/106 |
| 5,766,458 A * | 6/1998 | Sekhar et al. | 210/184 |
| 5,861,630 A * | 1/1999 | Becker | 250/423 R |
| 5,882,730 A | 3/1999 | Kimura | |
| 5,963,709 A * | 10/1999 | Staples et al. | 392/488 |
| 6,113,802 A * | 9/2000 | Penumella | 252/62 |
| 6,113,982 A * | 9/2000 | Claar et al. | 427/248.1 |
| 6,245,162 B1 | 6/2001 | Baudis et al. | 148/279 |
| 6,258,172 B1 | 7/2001 | Foster et al. | 118/717 |
| 6,306,225 B1 * | 10/2001 | Hunger et al. | 148/241 |
| 6,413,585 B1 * | 7/2002 | Madec et al. | 427/253 |
| 6,911,234 B2 | 6/2005 | Warnes et al. | |
| 7,767,274 B2 | 8/2010 | Skaff | |
| 7,935,426 B2 | 5/2011 | Vetter | |
| 7,955,569 B2 | 6/2011 | Patrovsky | |
| 8,007,922 B2 | 8/2011 | Mirchandani et al. | |
| 2003/0209534 A1* | 11/2003 | Ferguson | 219/548 |
| 2005/0208218 A1* | 9/2005 | Becker et al. | 427/248.1 |
| 2007/0098917 A1* | 5/2007 | Skaff | 427/569 |
| 2008/0191153 A1* | 8/2008 | Marganski et al. | 156/345.18 |
| 2008/0233428 A1* | 9/2008 | Skaff | 428/660 |
| 2009/0226688 A1 | 9/2009 | Fang | |
| 2009/0293993 A1* | 12/2009 | Zlatev et al. | 148/279 |
| 2010/0243335 A1 | 9/2010 | Dourfaye et al. | |
| 2010/0255198 A1* | 10/2010 | Cleary et al. | 118/726 |
| 2011/0293825 A1* | 12/2011 | Atwal et al. | 427/237 |
| 2012/0034378 A1* | 2/2012 | Woelk et al. | 427/248.1 |
| 2012/0046735 A1 | 2/2012 | Sill et al. | |
| 2012/0046757 A1 | 2/2012 | Breitenkamp et al. | |

FOREIGN PATENT DOCUMENTS

| | | | |
|---|---|---|---|
| GB | 663377 | 12/1951 | |
| JP | 54066383 A * | 5/1979 | C23C 13/12 |
| JP | 5285707 A | 11/1993 | |
| JP | 10068069 A * | 3/1998 | |
| JP | 10148102 A * | 6/1998 | |
| RU | 2008139354 A | 4/2010 | |
| WO | 9718912 A1 | 5/1997 | |
| WO | 2008066438 A1 | 6/2008 | |
| WO | 2008100155 A1 | 8/2008 | |
| WO | WO 2010094376 A2 * | 8/2010 | |

OTHER PUBLICATIONS

"Process Comparisons", Chapter 7, Surface Engineering for Corrosion and Wear Resistance, J.R. Davis, Ed., pp. 183-193. © 2001 ASM International.*

Cabeo et al., "Plasma-assisted boriding of industrial components in a pulsed d.c. glow discharge," Surface and Coatings Technology, Sep. 1999, pp. 229-233, vols. 116-119, Elsevier Science S.A.

Kaestner et al., "Plasma-assisted boriding of pure titanium and TiA16V4," Surface and Coatings Technology, Jul. 2001, pp. 248-252, vols. 142-144, Elsevier Science B.V.

Pertek, "Gas Boriding Conditions For The Iron Borides Layers Formation," Materials Science Forums, Jun. 1994, pp. 323-328, vols. 163-165, Trans Tech Publications, Switzerland.

Formanek, "The Diffusion Boronizing Process of Reactive Atmospheres Containing Boron Fluorides," Materials Science Forum, Jun. 1994, pp. 317-322, vols. 163-165, Trans Tech Publications, Switzerland.

Suwattananont, "Surface Treatment Of Ferrous Alloys With Boron," Aug. 2004, pp. 1-54, New Jersey's Science & Technology University.

Gupta et al., "Effect of stress-induced phase transformation on the properties of polycrystalline zirconia containing metastable tetragonal phase," Journal of Materials Science, Jul. 1978, pp. 1464-1470, vol. 13, Chapman and Hall Ltd., Great Britain.

Xu et al., "Effect of Micro-addition Rare Earth and Chrome on Friction and wear Behavior of boronized layer," Nov. 2005, Department of Materials Science and Engineering, Shandong Institute of Architecture and Engineering, Jian, China; Institute of Materials Science and Engineering, Shandong.

Capan et al., "Erosion-corrosion resistance of boronised steels," Materials Science Forums, Jun. 1994, pp. 329-334, vols. 163-165, Trans Tech Publications, Switzerland.

Palombarini et al., "Role of oxygen in iron boriding using boron carbide," Journal of Material Science Letters, May 1993, pp. 741-742, vol. 12, Chapman & Hall.

Su Z et al., "Effect of rare earth element on boronization kinetics," The Journal Jiliin kinetics, Engineering and Technology Edition, Jan. 2010, pp. 82-86 vol. 40, No. 1.

International Search Report and Written Opinion issued in PCT/US2013/031378 dated Jun. 5, 2013.

International Search Report and Written Opinion issued in PCT/US2013/031384 dated Jun. 5, 2013.

* cited by examiner

PROCESS AND APPARATUS TO TREAT METAL SURFACES

CROSS REFERENCE TO RELATED APPLICATIONS

This application claims the benefit of U.S. Provisional Application No. 61/610,883 filed Mar. 14, 2012, and U.S. Provisional Application No. 61/610,894 filed Mar. 14, 2012, which are both incorporated herein in their entirety by reference. The present invention is related to the application titled "KNIFE FOR WOOD PROCESSING AND METHODS FOR PLATING AND SURFACE TREATING A KNIFE" having U.S. patent application Ser. No. 13/795,948, which is a commonly-owned, and co-pending United States patent application that has been filed on the same date herewith, the entire contents and disclosure of which is expressly incorporated by reference.

BACKGROUND

The present disclosure relates to surface treatments of metals. Boronizing or boriding is generally known as a thermochemical diffusion technique used to harden and provide a corrosive barrier primarily to low carbon steels, thereby improving the wear-resistance of the treated metal piece. Several methodologies for boriding or boronizing have been developed. These technologies include: pack boriding, paste boriding, gas boriding, liquid boriding, plasma boriding, and fluidized bed boriding.

SUMMARY

In one aspect of the present disclosure, a method for treating metal parts is provided that may include positioning a metal piece within a reactor chamber and positioning a boron containing solid form having a porosity of at least 10% by volume in the reactor chamber adjacent to the metal work piece. In some embodiments, the method may further include introducing a halide containing gas to the reactor chamber in which the boron containing solid form is present. The at least one halide containing gas and the boron containing solid form react to provide a gas that borides the metal work piece.

In another embodiment of the present disclosure, a method of treating a metal part is provided that includes a boron containing heating element. In one embodiment, the method for treating metal parts includes positioning a metal work piece within a reactor chamber and positioning a boron containing heating element in the reactor chamber adjacent to the metal work piece. The boron containing heating element heats the reactor chamber. A halide containing gas may then be introduced to the reactor chamber where the boron containing heating element is present. The halide containing gas and the boron containing heating element react to provide a gas that borides the metal work piece.

In another embodiment, a method for treating metal parts is provided that includes positioning a metal work piece within a reactor chamber, and positioning a boron containing solid form in the reactor chamber adjacent to the metal work piece. A solid halide containing material may be thermally decomposed to form a halide containing gas in a treatment gas producing chamber that is separated from the reactor chamber. The halide containing gas may then be moved to the reactor chamber. The at least one halide containing gas and the boron containing solid form typically react to provide a gas that borides the metal work piece.

In another aspect of the present disclosure, a boriding treatment apparatus is provided that includes a reactor chamber comprising a boron containing heating element, and at least one treatment gas producing chamber in communication with the reactor chamber.

BRIEF DESCRIPTION OF SEVERAL VIEWS OF THE DRAWINGS

The following detailed description, given by way of example and not intended to limit the disclosed structures and methods solely thereto, will best be appreciated in conjunction with the accompanying drawings, wherein like reference numerals denote like elements and parts, in which.

DETAILED DESCRIPTION OF THE INVENTION

Figure 1:
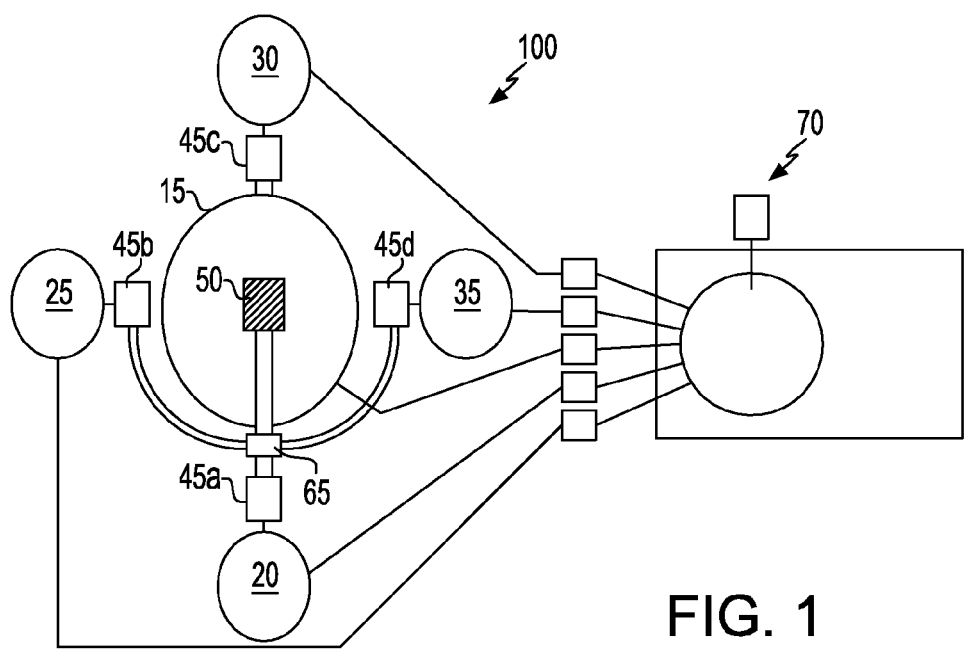
FIG. 1 is a side cross-sectional view of a boriding apparatus including a boride containing solid form, in accordance with one embodiment of the present disclosure.

Detailed embodiments of the claimed methods and structures are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures.

The methods and structures disclosed herein are related to boronizing metal parts, i.e., metal work pieces. The terms "boronizing" or "bonding" denote a surface treatment applied to a metal work piece in which boron (B) atoms are diffused into the surface of a metal work piece to form borides with the base material. In one embodiment, in which the metal work piece includes iron (Fe), such as steel, borides produced by boronizing may include iron boride (FeB) and/or iron-II-boride ($Fe_2B$). In some embodiments, the boronizing process in ferrous metals, such as steel, generally consists of two stages. The first stage of the boronizing process can include the deposition of a single molecular boron (B) compound layer of iron boride (FeB) created between the reactant and the metal work piece surface (metal surface). The nucleation of this new boron compound crystal seed, i.e., boride, is on the surface of the metal work piece and it is a function of time and temperature. After a complete layer of the boron compounds have been established on the surface, the second stage of the boronizing process can begin. The second stage of the boronizing process may include the diffusion of the boron compounds into the metal work piece, which in some embodiments can provide a bonded single or double layer with improved hardness and improved wear-resistance, as well as a corrosive barrier. The total thickness of the bonded layer at a constant temperature can be calculated by the formula: d=k square root of t, where d is the boron layer depth in microns (μm), k is the constant dependent temperature, and t is the time in seconds at that given temperature.

It has been determined that bonding using processes, such as pack boriding, paste bonding, liquid bonding, or fluidized bed bonding, can have a number of disadvantages. For example, the above bonding processes require cleaning processes following bonding to remove the bonding agent from the surface of the metal work pieces that have been treated. The above bonding processes also have difficulty in controlling the gas compositions at the reaction point. The above noted bonding processes are also labor intensive processes. Bonding by gas bonding or plasma bonding employs poisonous gasses, such as boron trifluoride ($BF_3$) and boron trichloride ($BCl_3$), as the bonding agent. In gas bonding or plasma bonding, the aforementioned poisonous gasses are stored in gaseous form prior to being employed as the bonding agent. Because of the poisonous nature of the bonding agent employed in typical gas bonding and/or plasma bonding, these bonding processes require special safety precautions, such as federal and State regulations of handling hazardous materials and the reporting thereof. Specialized equipment for the containment and isolation of poisonous and or potentially explosive materials. Redundant and expensive monitoring and dynamic equipment required to maintain a safe work environment and to the surrounding community.

In one embodiment, the methods and structures disclosed herein can overcome the aforementioned difficulties by employing at least one of a boron containing solid form that is adjacent to, but not in contact with, the metal work piece to be bonded; and by employing a halide containing gas that is formed within the bonding apparatus from a non-poisonous halide containing solid material. In some embodiments, the halide containing gas is formed by thermally decomposing a halide containing solid material in a treatment gas chamber that is separated from the reactor chamber. The halide containing solid material is not poisonous when in solid form. For example, the halide containing solid material may be potassium fluoroborate ($KBF_4$). Therefore, the halide containing solid material eliminates the requirement of storing poisonous, such as boron trifluoride ($BF_3$). The boron containing solid form is typically porous, and in some embodiments has an open cell porosity. In some embodiments, the boron containing solid form may also provide the heating element for controlling the temperature of the reactor chamber.

FIG. 1 depicts one embodiment of a bonding apparatus 100 including a boride containing solid form 50 having an open cell porosity. The term "solid form having a porosity" denotes a structure including a unitary solid matrix of a boron containing material, wherein an open cell porosity is dispersed throughout the unitary solid matrix of the boron containing material. By "boron containing" it is meant that the solid form has a boron concentration of at least 50 wt. %. In one embodiment, the boron concentration of the boron containing solid form 50 is at least 70 wt. %. In yet another embodiment, the boron containing solid form 50 has a boron concentration ranging from 75 wt. % to 95 wt. %. In yet a further embodiment, the boron containing solid form 50 has a boron concentration ranging from 80 wt. % to 90 wt. %. It is noted that the concentration of boron in the boron containing solid form 50 may be any value within the aforementioned ranges. For example, the concentration of boron in the boron containing solid form 50 may be 50 wt. %, 60 wt. %, 70 wt. %, 80 wt. %, 90 wt. % or 100 wt. %. In some embodiments, the above concentrations are typical of boron carbide. In other embodiments, when in the boron containing material is in form of "Ferro Boron", the boron content may be as low as 18%, which may be due to the density of the component materials. Ferro Boron may be employed in thin films and small areas where boron concentrations may be consumed without depletion. A possible additional boron source is amorphous boron and or crystalline boron.

In some embodiments, the boron containing solid form 50 may be composed of boron carbide. The boron carbide may be $B_4C$, but the present disclosure is not limited to only this composition of boron carbide, as the boron carbide may have the composition $B_nC$, wherein "n" may range from 4 to 10. In one example, when the boron carbide is $B_4C$, the boron content may be equal to 78 wt. % or greater. In another example, when the boron carbide is $B_{6.5}C$, the boron content may be equal to 85 wt. % or greater. Boron carbides are also known with carbon concentrations ranging from 8.8 to 20 atom %. $B_4C$ ($B_{12}C_3$) has a crystal structure of B11C icosahedra with C-B-C intericosahedral chains. Also included is the isolation of isotopes of boron. For example, elemental boron (B) has a boron makeup of 80% isotope $^{11}B$ and 20% $^{10}B$. However, in applications where the boron is used as a neutron absorber (radioactive applications) the isotope $^{10}B$ is isolated and can be used in 100% concentration.

In one example, the composition of the boron containing solid form 50 includes a combined boron and carbon (B+C) content ranging from 93 wt. % to 99 wt. %, a boron oxide ($B_2O_3$) content of 1.0 wt. % or less, an iron (Fe) content of less than 0.5 wt. % and a silicon (Si) content of less than 0.5 wt. %. In another example, the composition of the boron containing solid form 50 includes a combined boron and carbon (B+C) concentration ranging from 94 wt. % to 98.5 wt. %, in which the minimum boron content may range from 74 wt. % to 79 wt. % and the maximum carbon content may range from 17 wt. % to 24 wt. %. In this example, boron oxide ($B_2O_3$) may be present in an amount ranging from 0.1 wt. % to 1.0 wt. %, iron (Fe) may be present in an amount ranging from 0.2 wt. % to 0.5 wt. %, and silicon (Si) may be present in an amount ranging from 0.1 wt. % to 0.3 wt. %.

In some embodiments, boron carbide ($B_4C$) that is suitable for use with the methods and structures disclose herein may be produced by the high temperature, e.g., about ~1370° C. to ~2485° C., interaction of boric oxide ($B_2O_3$) and carbon (C) and/or magnesium (Mg) in an electrical resistance-type furnace. In the case of carbon (C), the reaction occurs at temperatures above the melting point of boron carbide ($B_4C$) and is accompanied by the production of carbon monoxide (CO), as follows:

$$2B_2O_3 + 7C \rightarrow B_4C + 6CO$$

If magnesium is used, the reaction can be carried out in a graphite furnace, and the magnesium byproducts are removed by treatment with acid.

A boron containing solid form 50 composed of boron carbide, e.g., $B_4C$, can be fabricated by hot pressing, sintering, and sinter-HIPing (HIP=hot isostatic press). Industrially, densification is carried out by hot pressing (3813° F. (~2100° C.) to 3992° F. (~2200° C.), 20 MPa to 40 MPa) in argon. Pressureless sintering may be employed with additives, such as carbon (C). In some embodiments, the boron containing solid form 50 may be manufactured from a sintering method at a temperature that is selected so that the boron containing solid form 50 has a density that is no greater than 60%.

In some embodiments, a porogen material may be included into the chemical pack used in forming the boron containing solid form 50. The porogen material can provide an open cell porosity to the boron containing solid form 50. The porogen material may be an outgassing material. In one example, the chemical pack typically includes a majority of boron (B) and carbon (C), iron (Fe) and silicon (Si). The porogen material may thermally decompose, or react with the chemical pack during the formation of the open cell porosity of the boron containing solid form 50.

Examples of porogen materials include carbon black, potassium borofluoride ($KBF_4$), chromic acid, thorium oxide, cerium oxide, and combinations thereof. The porogen may be present within the chemical pack that is used in forming the boron containing solid form 50 in an amount ranging from 0.5 wt. % to 25 wt. %. In another embodiment, the porogen may be present within the chemical pack that is used in forming the boron containing solid form 50 in an amount ranging from 3 wt. % to 10 wt. %.

In some embodiments, the boron containing solid form 50 may have an open porosity. As used herein, the term "open porosity" denotes pores that are open to the exterior of the structure containing the pores, e.g., the boron containing solid form 50, wherein gasses can flow through them. In some embodiments, the open porosity of the boron containing solid form 50 provides passages from one side of the boron containing solid form 50 to another side of the boron containing solid form 50, which allows for a gas, such as halide containing gas, to be passed through the boron containing solid form 50 for treating the surface of the metal work piece 10. In one embodiment, the porosity of the boron containing solid form 50 is equal to 10% or greater of the boron containing solid form 50 by volume. In another embodiment, the porosity of the boron containing solid form 50 ranges from 10% to 90% by volume. In another embodiment, the porosity of the boron containing solid form 50 may range from 20% to 80% by volume. In yet another embodiment, the porosity of the boron containing solid form 50 may range from 30% to 70% by volume. In one example, the porosity of the boron containing solid from 40% to 50%. In addition to boron carbide, the boron containing solid form 50 may also be ferro boron, amorphous boron, and possibly other boron containing compounds.

FIGS. 2A-2F depict one embodiment of a boron containing solid form 50 that is to be positioned adjacent to a metal work piece 10 for treatment within the boriding apparatus 100. In the embodiment that is depicted in FIGS. 2A-2F, the metal work piece 10 that is to be treated is a knife employed in wood chipping applications. It is noted that the knife depicted in FIGS. 2A-2F is only one example of a metal work piece 10 that can be treated using the method of the present disclosure. For example, knifes having different geometries than those depicted in FIGS. 2B and 2F can be treated using the boriding treatment apparatus 100 that is depicted in FIG. 1. It is further noted that the type of metal work piece 10 to be treated by the boriding treatment apparatus is not limited to only knife structures. For example, the metal work piece 10 may be component pump parts, valve parts, agricultural wear products, automotive parts, dies, balls, bearings, shaft journals, propellers, nozzles, turbines, screens, feed screws, mandrels, and other wear and corrosion resistance applications or a combination thereof. The metal work piece 10 may be any structure that is composed of a metal that can be diffused by boriding. In some embodiments, there may be restrictions where the melt temperature of the metal is less than the processing temperatures for the treatment. This can be the case when the metal being treated are aluminum, lead and zinc. In some instances, pure copper can also resist boronizing Alloys containing high trace elements of sulfur and phosphorus may also resist boronizing.

The metal work piece 10 is housed within an assembly that includes the boron containing solid form 50. In the assembly that is depicted in FIGS. 2A-2F, the boron containing solid form 50 is provided by sidewall elements of the assembly that include a treatment region 51, e.g., notch or cavity. Referring to FIG. 2F, the treatment region 51 provides that the boron containing solid form 50 be positioned adjacent to the metal work piece 10, but does not contact the metal work piece 10. The treatment region 51 of the boron containing solid form 50 is typically in communication with a gas passageway 60 so that a halide containing gas that is supplied to the reactor chamber 15 reacts with the boron containing solid form 50 to provide a gas that borides the metal work piece 10. In one example, communication between the gas passageway 60 and the metal work piece 10 is provided by the open cell porosity of the portion of the boron containing solid form 50 that is present between the treatment region 51 and the gas passageway 60. In this example, the halide containing gas, e.g., boron trifluoride ($BF_3$), which is formed in the later described first treatment gas production chamber 20, is passed through the gas passageway 60 to the treatment region 51. When the halide containing gas passes from the gas passageway 60 through the open cell structure of the boron containing solid form 50 to the treatment region 51, the halide containing gas reacts with the boron containing solid form 50 to provide the gas that treats, e.g., borides, the metal work piece 10. More specifically, in one example, a halide containing gas of boron trifluoride ($BF_3$) reacts with the boron carbide ($B_4C$) of the boron containing solid form 50 to produce boron difluoride ($BF_2$) and boron fluoride (BF) as the gas that treats, i.e., borides, the metal work piece. Some examples of reactions by which iron borides are formed in a metal work piece include:

$$3BF_2 + 2Fe \rightarrow Fe2B + 2BF_3$$

$$3BF_2 + Fe \rightarrow FeB + 2BF_3$$

The treatment region 51 of the boron containing solid form 50 can be configured to provide for a localized treatment of only a specified portion of the metal work piece 10. From this one may conclude that it is the boron difluoride ($BF_2$) or the boron fluoride (BF), which is diffused into the metal work piece 10. The free fluorine (Fl), which was bonded with the boron (B) in $BF_2$ or BF, react and result in a reconstituted boron trifluoride ($BF_3$), which in turn is available to re-react with the surface boron carbide (50) to begin the cycle again.

The boron containing solid form 50 may be positioned in close proximity to, but separated from the metal work piece 10 that is to be treated by the bonding apparatus 100. By separating the boron containing solid form 50 from the metal work piece 10 that is being treated, the methods and structures disclosed herein ensure that the boronizing agent is not bonded, sintered or otherwise engaged to the surface of the metal work piece 10 that is being boronized. This is distinguished from pack bonding, paste bonding, liquid bonding, or fluidized bed bonding, in which the boronizing agent is in direct contact with the surface being boronized. In pack bonding, paste bonding, liquid bonding, or fluidized bed bonding, because the boronizing agent is in direct contact with the surface being boronized during the high temperature boronizing process, the boronizing agent is typically engaged, bonded or sintered to the surface being treated. The boronizing agent, e.g., boron containing powder, frit or granulate, that is engaged to the boronized surface produced by pack bonding, paste bonding, liquid bonding, or fluidized bed bonding needs to be removed after the bonding process, which adds to the cost of the process and can also effect surface finish.

In addition to the benefit of the boronizing media not adhering to the metal work piece 10, the void or cavity created between the boron source, i.e., boron containing solid form 50, and the metal work piece 10 allows for a volume area for the mixing of potential subsequent layers of non-boron chemistries to be incorporated to the composite engineered surface zone.

The distance separating the boron containing solid form 50 from the metal work piece 10 is also selected to provide for efficient treatment of the metal work piece 10 with the gas, e.g., boron difluoride ($BF_2$), that is produced by reacting the halogen containing gas, e.g., boron trifluoride ($BF_3$), with the boron containing solid form 50. It has been found that the reaction rate of boron difluoride ($BF_2$) is so reactive, and in some examples is considered unstable and/or metastable), that in a volume of 1 $mm^3$ many billions of collisions take place. Each collision has the ability to alter the boron subhalide into a more stable state with the molecule in which it has come into contact. Thus, as a function of available un-reacted boron difluoride ($BF_2$) and boron monofluoride (BF) in a given distance, as volume increases the available non-reacted boron difluoride ($BF_2$) and boron monofluoride (BF) decreases. Concentration of boron (B) atoms on the surface of the metal work piece 10 is typically on the order of 9% for a layer of iron-II-boride ($Fe_2B$) to take place and above 16% for iron boride (FeB). In one example, the boron concentration in boron trifluoride ($BF_3$) is 15.944%. One reason why the boron containing solid form 50 is positioned sufficiently close to the metal work piece 10 is that sufficient concentrations of boron difluoride ($BF_2$) and boron monofluoroide (BF) can be required at the metal work piece 10 for boriding. In some embodiments, the boron containing solid form 50 is separated from the metal work piece 10 that is being treated by a distance of up to 10 millimeters (mm). In another embodiment, the boron containing solid form 50 is separated from the metal work piece 10 by a distance of up to 5 mm. In yet another embodiment, the boron containing solid form 50 is separated from the metal work piece 10 by a distance ranging from 1000 microns to 1 mm. In a further embodiment, the boron containing solid form 50 is separated from the metal work piece 10 by a distance ranging from 100 microns to 20 mm. In another embodiment, the boron containing solid form 50 is separated from the metal work piece 10 by a distance ranging from 100 microns to 0.1 mm. In yet another embodiment, the boron containing solid form 50 is separated from the metal work piece 10 by a distance ranging from 30 microns to 100 microns.

In some embodiments of the present disclosure, the boron containing solid form 50 eliminates the incidence of boronizing agent, e.g., boron containing power, frit or boron containing granulates, from being engaged surface being treated, because the boron containing solid form 50 is separated from the metal part 10 being treated. Further, because the boron containing solid form 50 is a unitary structure, instead of a loose powder or discrete granulates, the boronizing agent of the boron containing solid form 50 is not free to disperse from the boron containing solid form 50 and contact the metal part 10.

Figure 2A:
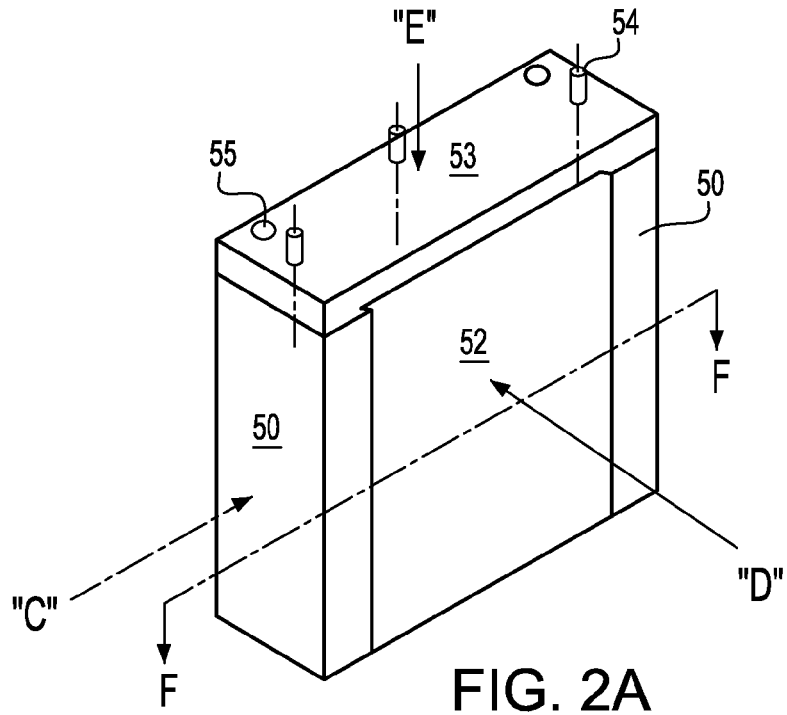
FIG. 2A is a perspective view of one embodiment of a boride containing solid form that is depicted in FIG. 1, in which the boride containing solid form is housing a metal work piece to be treated, in accordance with the present disclosure.
Figure 2B:
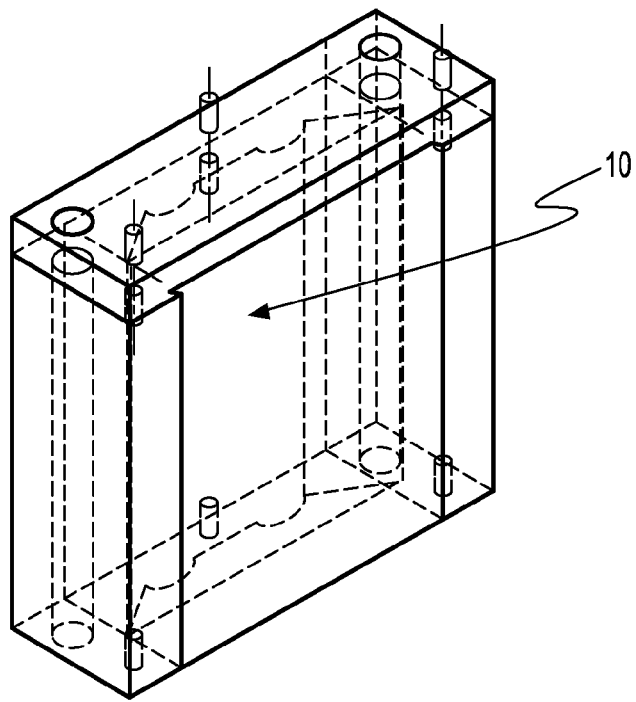
FIG. 2B is a perspective view of one embodiment of a boride containing solid form that is depicted in FIG. 2A, wherein the metal work piece being housed within the boride containing solid form is depicted with broken lines, in accordance with the present disclosure.
Figure 2C:
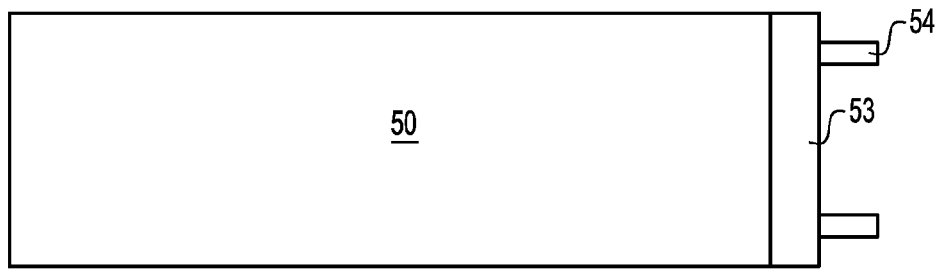
FIG. 2C is a side view of the boride containing solid form from the viewpoint identified by "C" in FIG. 2A.
Figure 2D:
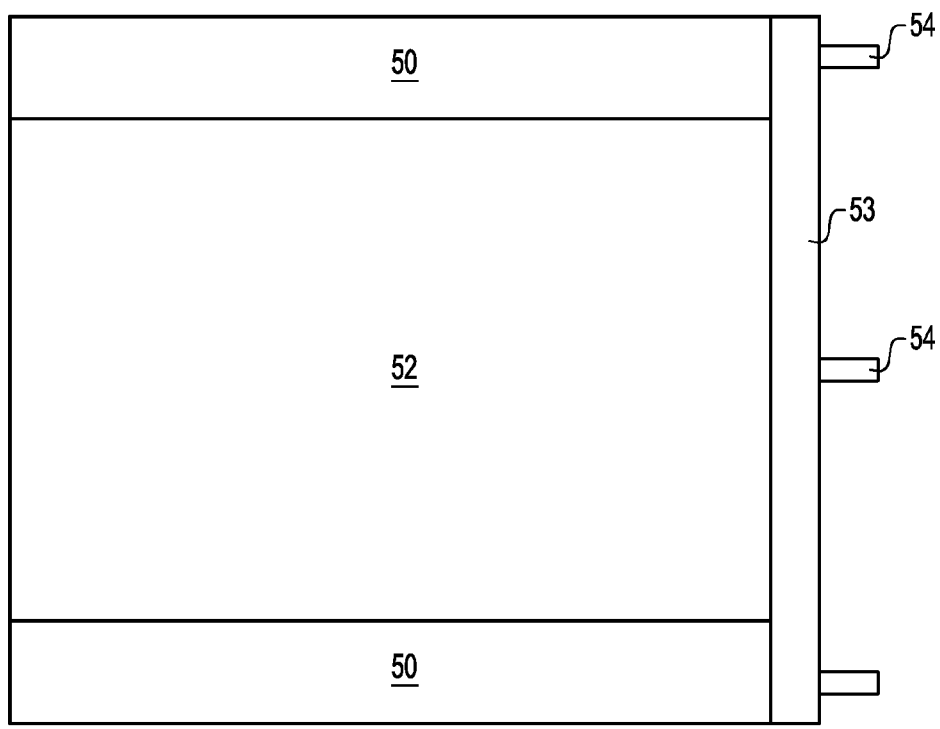
FIG. 2D is a side view of the boride containing solid form from the viewpoint identified by "D" in FIG. 2A.
Figure 2E:
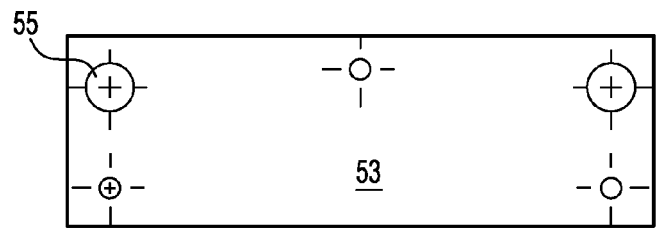
FIG. 2E is a top down view of the boride containing solid form from the viewpoint identified by "E" in FIG. 2A.
Figure 2F:
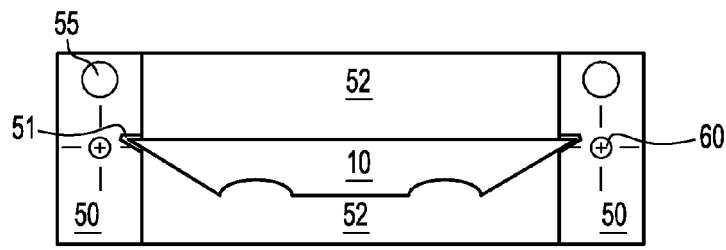
FIG. 2F is a cross-sectional view along section line F-F of the boride containing solid form that is depicted in FIG. 2A, wherein the boride containing solid form is housing a knife.

Referring to FIGS. 2A-2F, the assembly that includes the boron containing solid form 50 may also include a body portion 52 and a cap portion 53. In some examples, the body portion 52 and the cap portion 53 of the assembly including the boron containing solid form 50 may be integrated into a single unitary structure. The body portion 52 of the assembly typically houses the metal work piece 10, and positions the metal work piece 10 so that the portions of the metal work piece 10 that are to be bonded are adjacent to the sidewall elements of the assembly that are provided by the boron containing form 50. The body portion 52 of the assembly may have a cavity present therein matching the profile of the metal work piece 10, e.g., knife. The cap portion 53 may be employed to enclose the metal work piece 10 within the body portion 52, as depicted in FIG. 2B. The body portion 52 and the cap portion 53 may each be composed of refractory material, such as graphite (C), silicon carbide (SiC), aluminum oxide ($Al_2O_3$), silicon dioxide ($SiO_2$), zirconium dioxide ($ZrO_2$), magnesium oxide (MgO), and combinations thereof. In some embodiments, the body portion 52, the cap portion 53 and the sidewall elements provided by the boron containing form 50 may be connected by a series of dowel pins 54. The dowel pins 54 can be formed of a refractory material similar to the refractory material used for the body portion 52 and the cap portion 53. The dowel pins 54 can also be composed of a metal. Mounting openings 55 are also present through the cap portion 53 and the sidewall elements of the assembly that are provided by the boron containing form 50. In some embodiments, the mounting openings 55 allow for a plurality of assemblies of the boron containing form 50, cap portion 53 and body portion 52, which each house a metal work piece 10, to be stacked upon one another within the reactor chamber 15 of the bonding apparatus 100. This can provide for multiple work pieces 10 to be treated within the reactor chamber 15 simultaneously.

In some embodiments, the treatment region 51 of the boron containing solid form 50 can be configured to provide for a localized treatment of only a specified portion of the metal work piece 10. For example, in the embodiment that is depicted in FIGS. 2A-2F, the treatment region 51 of the boron containing solid form 50 may be configured to have a geometry that mirrors the geometry of the tip of the knife that provides the metal work piece 10. The tip of the knife is the apex between the cutting side and the release side of the knife, i.e., wood chipping knife. In this embodiment, the treatment region 51 of the boron containing solid form 50 may be a notch in the sidewall of the boron containing solid form 50. In this instance, by positioning the apex of the chipper knife within the notch region 51, the metal work piece 10, i.e., chipper knife, is being positioned adjacent to the boron containing solid form 50 for the bonding operation.

In some embodiments, the boron containing solid form 50 also provides a heating element. In this embodiment, the boron containing solid form 50 converts electricity into heat through the process of joule heating. More specifically, to provide a heating element for the reactor chamber of the boriding apparatus 100, electrical current is passed through the boron containing solid form 50. The electrical current that is passed through the boron containing solid form 50 encounters resistance, resulting in heating of the element. In some embodiments, the boron containing solid form 50 is porous and does not conduct electricity well at low temperature. However, once we are at reaction temperature, the conductivity of the boron carbide form 50 is greatly improved. Because the energy source (heat) is localized to the metal work piece 10, the use of the boron carbide form 50 as a heating element may increase the efficiency of the treatment. In the embodiments, in which the boron containing solid form 50 provides a heating element, the porosity of the boron containing solid form 50 is greater than 10%, and in some examples may be on the order of 40%.

As indicated above, the boron containing solid form 50 and the metal work piece 10 are each positioned within the reactor chamber 15 of the boriding apparatus 100 that is depicted in FIG. 1. Reference number 50 in FIG. 1 is depicting a boron containing solid form as part of an assembly housing the metal work piece 10, as depicted in FIGS. 2A-2F. Although the reactor chamber 15 is depicted as having a circular geometry, the reactor chamber 15 is not limited to only the geometry that is depicted in FIG. 1. The reactor chamber 15 may have any geometry that can contain the boron containing solid form 50 and the metal work piece 10. For example, the reactor chamber 15 may be multi-sided, such as rectangular, or the reactor chamber 15 may be cylindrical. The reactor chamber 15 may have walls composed of a metal, such as stainless steel. The reactor chamber 15 may also have walls that are composed of a glass, ceramics, mica, high temperature composites (metal, polymer, ceramic, clay\mineral) or a combination thereof. The reactor chamber 15 may also include a number of openings, in which each opening is connected to a reaction gas production chamber 20, 25, 30, 35 through a manifold 65 and a plurality of valve assemblies 45a, 45b, 45c, 45d. In some embodiment, a heating element may be integrated with the reactor chamber 15. For example, the heating element may be the boron containing solid form 50. In other examples, another heating element may be used in combination with the boron containing heating element, such as convection heater, a heat lamp, a conductive heater, a microwave heater, a resistive heater, inductive, RF, chemical reaction heater (CRH) or a combination thereof. In yet another example, the boron containing solid form 50 does not function as a heating element, and the temperature of the reactor chamber 15 is controlled by at least one of a convection heater, a heat lamp, a conductive heater, a microwave heater, inductive heater, radio frequency heater, chemical reaction heater, and a resistive heater.

Still referring to FIG. 1, in some embodiments, the boriding apparatus 100 further includes at least one treatment gas producing chamber 20, 25, 30, 35 that in communication with the reactor chamber 15 through a manifold 65. The at least one treatment gas producing chamber 20, 25, 30, 35 provides a gas used in the treatment of the metal work piece 10 by the boriding apparatus 100. Although FIG. 1 depicts four treatment gas producing chambers 20, 25, 30, 35, the present disclosure is not limited to only this embodiment. Any number of treatment gas producing chambers 20, 25, 30, 35 have been contemplated for use with the boriding apparatus 100 disclosed herein.

At least one of the treatment gas producing chambers 20, 25, 30, 35 may be a furnace. In some embodiments, the heating element of the furnace for each of the treatment gas producing chambers 20, 25, 30, 35 may be a convection heater, a heat lamp, a conductive heater, a microwave heater, a resistive heater, inductive heater, radio frequency heater (dipole rotation), chemical reaction heater, or a combination thereof. In some examples, the heating element may be a resistance wire, bar, tube, or ribbon composed of kathal (Fe-CrAl), nichrome 80/20, copper nickel alloys, silicon carbide, graphite & carbon composites, molybdenum disilicide ($MoSi_2$) and molybdenum disilicide doped with aluminum (Al). The heating element may also be composed of positive thermal coefficient of resistance (PTCR) ceramics, such as barium titanate and lead titanate composites. As for the chemical reaction heater, chemical reactions that are exothermic (thermite, ALICE aluminum ice) and are contained in a suitable designed reactor in which the chemicals come together, react producing heat, this heat is stored in well insulated radiant tubes and blended with applicable volumes of air and circulated around the retort to be heated.

At least one of the treatment gas producing chambers 20, 25, 30, 35 may be a furnace. In some embodiments, the heating element of the furnace for each of the treatment gas producing chambers 20, 25, 30, 35 may be a convection heater, a heat lamp, a conductive heater, a microwave heater, a resistive heater, or a combination thereof. In some examples, the heating element may be a resistance wire or ribbon composed of kathal (FeCrAl), nichrome 80/20, copper nickel alloys, molybdenum disilicide ($MoSi_2$) and molybdenum disilicide doped with aluminum (Al). The heating element may also be composed of positive thermal coefficient of resistance (PTCR) ceramics, such as barium titanate and lead titanate composites.

In some embodiments, the first treatment gas producing chamber 20 produces a halide containing gas for reacting with the boron containing solid form 50 to produce the gas for boronizing the metal work piece 10 within the reactor chamber 15. Treatment gasses may also be produced by the remaining reactive gas producing chambers 25, 30, 35 to provide at least one of an aluminum (Al) element for boroaluminizing, a silicon (Si) element for borosiliconizing, a chrome (Cr) element for borochromizing, a vanadium (V) element for borovanadizing and a combination thereof. The addition of the rare earth element in combination with any of these multi-component boriding compounds can be advantageous. For example, the ability of the rare earth element to diffuse into the target metal part, i.e., metal work piece 10, can enhance the rate and quality of boron diffusion. Rare earth molecules can be large, and can spread the crystalline boundaries where the flow of diffusion takes place. Rare earth metal elements include are found in group 3 of the periodic table, and the 6th and 7th periods. The lanthanide series of rare earth elements include lanthanum, cerium, praseodymium, neodymium, promethium, samarium, europium, gadolinium, terbium, dysprosium, holmium, erbium, thulium, ytterbium, and lutetium. The actinide series of rare earth elements include actinium, thorium, neptunium, plutonium, americium, curium, berkelium, californium, einsteinium, ferium, mendelevium, nobelium, lawrencium and a combination thereof. It is further noted that additional elements may be incorporated into the treatment gas from Groups IV through Group X, i.e., Group V, Group VI, Group VII, of the Periodic Table of Elements.

Each of the treatment gas producing chambers 20, 25, 30, 35 may be in communication to the reactor chamber 15 though a manifold 65 and a valve assembly 45a, 45b, 45c, 45d. More specifically, the manifold 65 includes a gas line into the boron containing solid form 50. In some embodiments, a valve controlled manifold is present between the manifold 65 and the boron containing solid form 50. The valve of the valve controlled manifold 65 may be micro or needle valve. In some embodiments, the valve controlled manifold 65b may direct a potential gas flow through the gap or cavity that is present between the boron containing solid form 50 and the metal work piece 10, without requiring that the potential gas flow be filtered through the porosity of the boron containing solid form 50. This can be helpful in some applications where a post boron (B) layer needs to be deposited without possibly contaminating the boron source, filling the porosity, and/or controlling concentration levels by flowing an inert gas into the reacted gas before it comes in contact with the target part.

A gas line also extends from each of the valve assemblies 45a, 45b, 45c, 45d to the manifold 65. Each of the valve assemblies 45a, 45b, 45c, 45d can provide an open and closed position to each of the respective treatment gas producing chambers 20, 25, 30, 35. In some embodiments, each of the valve assemblies 45a, 45b, 45c, 45d may also be positioned in a partially open or partially closed position to regulate the flow of gas or combine different concentrations of gasses coming from different gas producing chambers into the reactor chamber 15 at different times during the formation of composite layers. When the valve assembly 45a, 45b, 45c, 45d is open, the at least one treatment gas producing chamber 20, 25, 30, 35 is in communication with the boron containing solid form 50 within the reactor chamber 15 through the manifold 65. By "in communication" it is meant that gasses from the at least one treatment gas producing chamber 20, 25, 30, 35 can be transported to the boron containing solid form 50 that is present in the reactor chamber 15. When the valve assembly 45a, 45b, 45c, 45d is closed, the at least one treatment gas producing chamber 20, 25, 30, 35 is separated from the reactor chamber 15. By "separated from" it is meant that gasses from the at least one treatment gas producing chamber 20, 25, 30, 35 can not move, i.e., be transported to, the reactor chamber 15.

The first treatment gas producing chamber 20 is typically separated from the reaction chamber 15 by a closable valve assembly 45a. The closable valve assembly 45a allows for the solid halide containing material to be thermally decomposed into a halide containing gas within the first treatment gas producing chamber 20 separated from the reactor chamber 15. After decomposition of the solid halide containing material, the halide containing gas is transported to the reaction chamber 15 to react with the boron containing solid form 50. The halide containing material may be a compound of a metal that is combined with at least one of chlorine, bromine, fluorine, iodine, and astatine. In one embodiment, by decomposing the solid halide containing material in the first reaction gas production chamber 20 to provide the halide containing gas, the methods and structures disclosed herein can eliminate the requirement of storing a dangerous and/or poisonous gas, such as boron trifluoride ($BF_3$). In some embodiments, it is not required that a halide containing gas be employed. For example, when boronizing titanium (Ti), or a titanium (Ti) alloy, sodium carbonate ($Na_2CO_3$) may be used instead of boron trifluoride ($BF_3$) activator. This is because titanium (Ti) is attached by fluorides in an acidic atmosphere. This is one case where halides are not used to produce a borided surface.

The boriding apparatus 100 may further include a vacuum pump assembly 70 that may be connected to each of the treatment gas producing chambers 20, 25, 30, 35, and the reactor chamber 15. The vacuum pump assembly 70 can dictate the pressure for each of the treatment gas producing chambers 20, 25, 30, 35, and the reactor chamber 15. Air and moisture is removed by pumping down the reactor chamber 15, the treatment gas producing chambers 20, 25, 30, 35, and the associated plumbing, which vacates the voids, i.e., porosity, in the boron containing solid form 50 and the treatment region 51 of the boron containing solid form 50. Thereafter, the system including the reactor chamber 15 is backfilled with argon (Ar), hydrogen (H), argon/hydrogen (Ar)/(H), or helium (He) gas.

Figure 3:
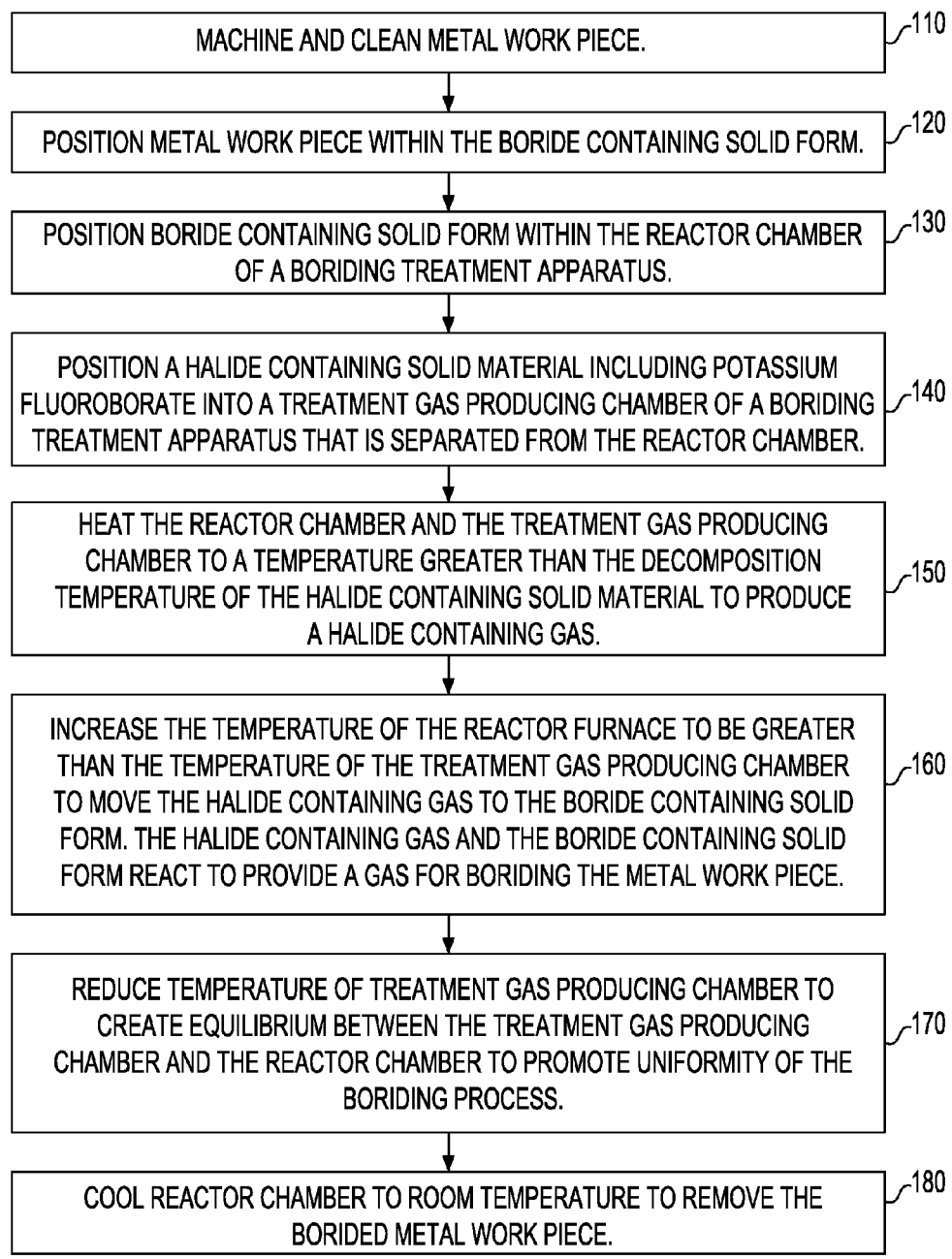
FIG. 3 is a flow chart depicting boriding a metal work piece with a boriding apparatus that includes a boride containing solid form, in accordance with one embodiment of the present disclosure.

FIG. 3 depicts a flow chart for one embodiment of a boriding process employing the boriding apparatus 100 that is depicted in FIG. 1, and the assembly including the boron containing solid form 50 that is depicted in FIGS. 2A-2F. It is noted that the flow chart depicted in FIG. 3 only depicts one embodiment of a boriding process that may be employed in combination with the boriding apparatus 100 and the boron containing form that have been described above with reference to FIGS. 1-2F. It is further noted, that the flow chart depicted in FIG. 3 may include additional steps that are not specifically depicted in the supplied figures. For example, additional initial process steps may be employed prior to the step 110 of machining and cleaning the metal work piece 10 of the process flow depicted in FIG. 3. Further, additional finalizing process steps may be employed after cooling the reactor chamber 15, and removing the borided metal work piece 10 from the reactor chamber 15, in step 180 of the process flow depicted in FIG. 3. Additionally, intermediate process steps may be performed between each of the specific process steps that are illustrated in the flow chart depicted in FIG. 3.

In some embodiments, the boriding apparatus 100 can provide for independent control of the temperature in the reactor chamber 15 that is containing the metal work piece 10 that is to be borided, and independent control of the temperature of each of the treatment gas producing chambers 20, 25, 30, 35. It has been determined that the temperature of the components of the boriding apparatus 100, such as the reactor chamber 15 and the treatment gas producing chambers 20, 25, 30, 35, can have a dynamic effect on the boriding treatments. Temperature can affect the chemical mechanical energy of the boriding elements, i.e., the frequency and force that the atoms, e.g., boron (B), strike each other.

Too high a temperature increases the speed at which the atoms move, which can make bonding of the boriding elements to the metal work piece 10 being treated difficult. Temperature is believed to dictate the frequency that new atoms, e.g., iron (Fe), boron (B), are available to replace the already reacted atoms, i.e., $Fe_2B$ and FeB. In some embodiments, the desired composition is the iron-II-boride phase, because of its greater ductility and the difference of thermal expansion rates between the two layers of iron boride (FeB) and iron-II-boride ($Fe_2B$) creates stresses that can result in spalling and delamination. In some embodiments, it is an objective of the methods and structures disclosed herein to maintain a boron concentration of not less than 8.5% and not greater than 15.8% to form the iron-II-boride ($Fe_2B$) phase. Temperature can influence boron concentration. The temperature can affect concentrations levels. For example, if the temperature of the metal work piece 10 is too hot, the boron concentration can drop below 8.5%. In another example, if the temperature of the metal work piece 10 is to cold, the boron concentration can exceed 16%.

Because of temperature, the speed in which the grain structure changes due to internal equilibrium can influence the rate and the structure of the growing nucleating cell. Temperature also affects the chemical reactions in decomposition, as well as the chemical concentrations throughout the system. For example, the temperature effects the decomposition of potassium borofluorate ($KBF_4$), which results in the formation of boron trifluoride ($BF_3$) for reaction with boron carbide ($B_4C$) to provide a boriding gas, such as boron difluoride ($BF_2$). The temperature can also moderate a reaction's energy flow effecting reaction equilibrium. The movement of the reactant gas to the growth of the nucleated crystal, follows the lattice or grain boundary, and may depend on orientation of the crystal planes and the resistance of the static and kinetic forces at the operating temperature of each of the element making up the alloy of the metal work piece being borided. In the initial deposit and migration of the newly formed seeds of iron boride (FeB) and iron-II-boride ($Fe_2B$), the grain orientation has a low angle grain boundary, the seeds of nucleation along with defects associated with stress-strain mechanics influence dislocations, which in this dynamic system result in misorientation. Because of the physical properties of the nucleated iron boride (FeB), first and subsequent iron-II-boride ($Fe_2B$) phases, in relationship to the parent metal part, the high elastic limit of the iron boride (FeB) reduces the number of dislocations being formed by the bending of the lattice. As these grains continue to grow, the energy along the boundary accumulates until the force of flow of the diffusion atoms are greater than the static forces of developing grains. This causes the grain to shift or reorient itself so that the boundary is perpendicular to the surface. A boundary moves due to pressure acting on it. It is generally assumed that the velocity is directly proportional to the pressure with the constant of proportionality being the mobility of the boundary. The mobility is strongly temperature dependent and often follows an Arrhenius type relationship:

$$M=M_o\exp(-Q/RT)  \quad \text{Linear kinetic equation}$$

M=Mobility
$M_o$=Boundary being curved
Q=Energy Barrier or Activation Energy
R=Reaction Rate
T=) Reaction Rate On the two sides of the boundary are reaction rates of the materials separated by the boundary, The R and T designations represent reaction rates these two different crystalline systems. For example, as temperature increases within the range of 1470° F. (~800° C.) to 1877° F. (~1025° C.), the concentration of boron difluoride ($BF_2$) may increase (primary reactant with 2Fe iron in forming $Fe_2B$) from a reaction of $BF_3$ and $B_4C$ ($BF_3$ reacts with boron carbide producing $BF_2$) according to the reaction equation:

$$8BF3+B4C \rightarrow 12BF_2+C.$$

It is further believed that if an accumulation of boron (B) on the surface of the metal work piece 10 is too rapid, a "black layer" is created, which when analyzed shows a chemistry high in amorphous boron. A black layer may also be obtained when contaminates of oxygen are present in the system, which can result in the formation of a boron oxide ($B_2O_3$) layer. The presence of a black layer on the metal work piece 10 can obstruct bonding. As will be further described in the process flow depicted in FIG. 3, the boroding apparatus 100 depicted in FIG. 1 can independent control the temperature of the reactor chamber 15 and the temperature of the first treatment gas producing chamber 20, second treatment gas producing chamber 25, third treatment gas producing chamber 30 and fourth treatment gas producing chamber 35.

Therefore, in some embodiments, by isolating and controlling not only the temperature of the metal work piece 10, but separately controlling the temperature of the bonding gasses, and when the bonding gasses are available to the metal work piece 10, the boroding apparatus 100 and process flow provided herein can control a bonding process in a manner that has not been previously been provided. For example, the bonding apparatus 100 that is depicted in FIG. 1 can emulate the bonding conditions, e.g., temperature of the work piece and concentration of boron provided by the bonding agent, of a bonding pack process without requiring that the metal work piece 10 be subjected to direct contact with the bonding agent. In this manner a bonding process is provided that does not result in a boriding agent, such as a boron containing frit or powder, being engaged to the surface of the work piece 10 in a manner that requires cleaning steps for removal.

Further, by isolating and controlling the temperature of the reactor chamber 15 and the treatment gas producing chamber 20 independently, the boriding apparatus 100 allows for control of the movement of gasses formed in the treatment gas producing chamber 20 between the treatment gas producing chamber 20 and the reactor chamber 15. For example, when the boriding gas has a higher temperature than the temperature of the metal work piece 10, the boriding gas may condense on the metal work piece 10 providing a higher concentration of boron at the surface of the metal work piece 10. When the temperature of the metal work piece 10 and the temperature of the boriding gas are the same, the concentrations may be balanced. When the temperature of the metal work piece 10 is higher than the temperature of the boriding gas, the concentrations of boron at the surface of the metal work piece 10 will decrease.

In some embodiments, control of the temperature of the metal work piece 10, and control of the temperature of the boron containing solid form 50 that provides the reaction site for forming the boriding gas, is provided by the boron containing solid form 50 that functions as a heating element. As depicted in FIGS. 2A-2F, when the boron containing solid form 50 is the heating element for the reactor chamber 25, the close proximity of the boron containing solid form 50 to the metal work piece 10 allows for the temperature of the metal work piece 50 to be precisely controlled.

To assure the proper temperature of the reactant gasses, i.e., boron trifluoride ($BF_3$) and boron difluoride ($BF_2$), the boriding apparatus 100 can monitor the reactant gas chemical composition and concentrations at both the reactant site, i.e., metal work piece 10 and/or boron containing solid form 50, as well as where it is being created and transported. Using real time monitoring of the reactant gasses allows for computer programming to maximize efficiencies and control each batch to a predetermined quality standard. This can be achieved using a Hiden Analytical real time gas analyzer, such as a Hiden HPR-20 QIC quadpole spectrometer, for multiple species gas and vapor analysis.

The bonding apparatus 100 is a system that can provide a balanced state during the bonding operation, because of the temperature controlled furnace operations. Due to the enthalpy of reaction taking place between the boron trifluoride ($BF_3$) and the boron containing solid form 50 of boron carbide ($B_4C$), the newly created boron difluoride ($BF_2$) has additional energy (heat) in a micro system. The second law of thermodynamics indicates, entropy, matter goes from a higher order to a lower order, i.e., higher heat to lower heat. In the system, the reactant gas is believed to be thermally conducted. The boron trifluoride ($BF_3$) from the decomposed potassium fluoroborate ($KBF_4$) (potassium fluoroborate ($KBF_4$) thermally decomposed to produce potassium fluoride (KF) and the more reactive boron trifluoride ($BF_3$)) condenses on the steel (Fe) surface of the metal work piece 10. In some embodiments, a reaction between the iron (Fe) and the boron trifluoride ($BF_3$) produces a surface layer of iron fluoride ($FeF_3$), wherein the boron in the form of amorphous boron (B) reacts with the iron fluoride $FeF_3$ surface creating a monomolecular p-solid state layer initiated on surface inclusions of iron boride (FeB). Additionally, the decomposition of fluoroborate ($KBF_4$) into boron trifluoride ($BF_3$) and potassium fluoride (KF) provides the catalysis or precursor for reaction with the boron containing solid form 50 of boron carbide ($B_4C$) to provide a bonding gas of boron difluoride ($BF_2$). The reaction between the boron trifluoride ($BF_3$) and the boron carbide ($B_4C$) of the boron containing solid form to provide a bonding gas of boron difluoride ($BF_2$) is as follows:

$$BF_3 + B_4C \rightarrow 12BF_2 + C$$

In some embodiments, boron difluoride ($BF_2$) plays a major role in bonding the metal work piece 10, i.e., forming borides in the metal work piece 10. The following reactions are representative of boride formation in an iron (Fe) containing metal work piece 10 treated with a bonding gas of boron difluoride ($BF_2$):

$$3BF_2 + 2Fe \rightarrow Fe_2B + 2BF_3, \text{ and}$$

$$3BF_2 + Fe \rightarrow FeB + 2BF_3$$

This provides the continued boron trifluoride ($BF_3$) to react with the boron carbide, e.g., $B_4C$, of the boron containing solid form 50 at the point of reaction, as the above equations illustrate. This is additional to the boron trifluoride ($BF_3$) from the decomposition of fluoroborate ($KBF_4$). Initial boriding of the metal work piece 10 can be referred to as a solid phase epitaxy stage, which is a transition between the amorphous and crystalline phases of a material. The continuing reaction between the boron difluoride ($BF_2$) and the elements of the steel may be impeded by the initial single layer of iron boride (FeB). In view of the initial iron boride (FeB) layer, the reaction is slowed adequately with iron (Fe) so that the rate of diffusion facilitates a 2 parts iron (Fe) to 1 part boron (B) ratio, i.e., iron-II-boride ($Fe_2B$). In some applications, the 2 parts to 1 part ratio of iron (Fe) to boron (B) is at the surface of the metal work piece 10, and may be desirable because iron-II-boride ($Fe_2B$) is more ductile than iron boride (FeB). Further, the thermal expansion between the two different phases of iron boride (FeB) and iron-II-boride (Fe2B) is high, which can create a difference in the expansion and contraction between the two layers of different boride composition, which can build up stored energy in the form of stress.

The available boron (B) for diffusion into the metal work piece 10 that is provided by the methods and structures of the present disclosure may be in a concentration of 5 wt. % to 20 wt. % by molar mass. In another embodiment, the boron (B) diffused into the metal work piece 10 may be in a concentration ranging from 8 wt. % to 18 wt. %. In yet another embodiment, the boron (B) that is diffused into the metal work piece 10 may be in a concentration ranging from 9 wt. % to 16 wt. %. When the concentration of the boron diffused in the iron (Fe) containing metal work piece 10 ranges from 8.83 wt. % and 16.23 wt. %, the boride being formed in the metal work piece may be iron-II-boride ($Fe_2B$). When the concentration of the boron diffused in the iron (Fe) containing metal work piece 10 is greater than 16.23 wt. %, the boride being formed in the metal work piece 10 may be iron boride (FeB).

In some embodiments, the boriding process provided by the boriding apparatus depicted in FIG. 1, and the process flow illustrated in FIG. 3, may provide a single layer of iron-II-boride ($Fe_2B$), and a singular molecular layer (or other small amount) of iron boride (FeB) in the metal work piece 10. For example, the single layer of iron-II-boride ($Fe_2B$) may have a thickness ranging from 2 microns to 500 microns, and the thickness of the singular crystalline layer of iron boride (FeB) may range from 280 Å to 480 Å. The single molecular layer of iron boride (FeB) can be acceptable, because of the small effect of such a small layer.

Referring to FIG. 3, in some embodiments, the boriding process may begin with an initial step 110 of machining and cleaning the metal work piece 10. The metal work piece 10 to be treated within the boriding apparatus 100 may be composed of a ferrous metal, e.g., iron (Fe) containing metals, or non-ferrous metal, or metals with compositions that include titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co) and nickel (Ni). For example, the metal work piece 10 may be composed of a low carbon steel, e.g., a steel having a carbon content of 0.05 wt. % to 0.15 wt. % and a majority of iron (Fe). In another example, the metal work piece 10 may be composed of steel having a carbon content ranging from 0.45 wt. % to 0.60 wt. %. In yet another example, the metal work piece 10 may be composed of a steal having a carbon content ranging from 0.47 wt. % to 0.52 wt. %, which is suitable for knife blades used in wood chipping and pulping operations. Examples of low carbon steel that are suitable for boriding in accordance with the methods and structures disclosed herein include, but are not limited to, AISI 1005-1026, AISI 1108-1119, AISI 1211-1215, AISI 1513-1527, and combinations thereof. It is noted that the above compositions are provided for illustrative purposes only, and that other metals that are not described above are equally suitable for being treated using the boriding apparatus 100.

A machining process may be applied to the metal work piece 10. For example, when the metal work piece 10 is a knife that is employed in wood chipping, debarking, or sawmill, knotters, centrifuges, screens, blowing breaking bars and plate applications, a physical machining process may be applied to the metal work piece 10. For example, a grinding or straightening process can be applied to the metal work piece 10. In one embodiment, in which the metal work piece 10 is a knife, such as a wood chipping knife, the machining process may restore the sharpness of the cutting surface. For example, a series of grinders and polishing stones may be applied to restore the sharpness of the cutting surface. Electrochemical machining processes may also be applied to metal work piece 10. It is noted that the above description of machining processes is not limiting, as other machining processes. For example, when restoring the cutting surface of a knife, e.g., wood chipping knife, any machining process that can be characterized as smoothing, polishing and lapping are within the scope of the present disclosure, as a machining process in accordance with step 110 of FIG. 3. Following machining, a cleaning process may be applied to the metal work piece 10, such as a chemical cleaning process or a electro-chemical cleaning process. For example, the cleaning process includes a de-oxidation step. For example, the cleaning process may include acidic cleaners, alkaline cleaners, and combinations thereof. In other examples, a plasma cleaning process may be employed. In one example, the cleaning process may employ one of hydroflouric acid or phosphoric acid. In some examples, the machining and cleaning processes of step 110 may be omitted from the process flow that is depicted in FIG. 3.

Following any desired machining and/or cleaning, the metal work piece 10 may be positioned within the boron containing solid form 50 at step 110. In the embodiments, in which the boron containing solid form 50 is a component of an assembly, as depicted in FIGS. 2A-2F, the boron containing solid form 50 may first be inserted into the body portion 52 of the assembly. More specifically, in some embodiments when the work metal piece 10 is a knife, the metal work piece 10 is inserted into a fixed position within the body portion 52 of the assembly so that the tip portions of the knife extend outward from the body portion 52. The sidewall elements for the assembly that are composed of the boron containing solid form 50 are then contacted to the sidewalls of the body portion 52 so that the tip of the knife is positioned within the treatment region 51 of the boron containing solid form 50. By being positioned the portion of the metal work piece 10, i.e., tip of the knife, to be treated within the treatment region 51 of the boron containing solid form 50, but not contacting the boron containing solid form 50, the assembly eliminates the incidence of the boriding agent sticking to the surface of the metal work piece 10. This eliminates the requirement of additional cleaning steps to remove the bonding agent from the surface of the piece being bonded. Referring to FIGS. 2A-2F, in the embodiments, in which the cap portion 53 of the assembly is separated from the body portion 52 of the assembly, the cap portion 53 may then be positioned on the body portion 52. By positioning the cap portion 53 on the body portion 52 that contains the metal work piece 10, the cap portion 53 encloses the metal work piece 10 within the body portion 52 of the assembly between the cap portion 53 and the sidewall elements that are provided by the boron containing solid form 50. Dowel pins 54 may be employed to align the cap portion 53, the body portion 52 and the boron containing solid form 50 together in forming the assembly. The dowel pins 54 may also fasten the cap portion 53, the body portion 52 and the boron containing solid form 50 together.

Referring to FIGS. 1 and 3, the assembly including the boron containing solid form 50, and the metal work piece 10 may then be positioned within the reactor chamber 15 of the boriding apparatus 100. It is noted that a single assembly housing a single metal work piece 10 may be positioned within the reactor chamber 15 of the boriding apparatus 100, or a multiple assemblies each including a single metal work piece 10 may be positioned within the reactor chamber 15 of the boriding apparatus 100 so that multiple metal work pieces 10 may be treated within the reactor chamber 15 simultaneously. In some embodiments, when multiple metal work pieces 10 are being simultaneously treated within the reactor chamber 15, the multiple assemblies may be stacked on a rack, wherein alignment between the stacked assemblies is provided by the mounting openings 55 that extend through the cap portion 53 of the assembly and the sidewall elements of the assembly that are provided by the boron containing solid form 50.

In some embodiments, each of the assemblies including the boron containing solid form 50 may be connected through a gas line to the manifold 65 of the boriding apparatus 100 so that the halide containing gas, e.g., boron trifluoride ($BF_3$), can be directly injected to the each of the boron containing solid forms 50. In another embodiment, a gas line from the manifold 65 may be in direct contact with the boron containing solid form 50 of one assembly, in which communication between the adjacent assemblies is provided by a passageway extending through the boron containing solid form 50 from one face of the form to an opposing face of the form. More specifically, the passageway through the boron containing solid form 50 is aligned to the passageway through the adjacent boron containing solid forms 50. In this manner, a continuous passageway is provided from the gas line contact to the first boron containing solid form 50 and through the adjacent boron containing solid forms 50.

In step 140 of the bonding process flow depicted in FIG. 3, a reaction gas forming solid halide containing material may then be introduced to at least one of the treatment gas producing chambers 20, 25, 30 25. The solid halide containing material may include a metal salts, such as potassium (K), sodium (Na), lithium (Li), magnesium (Mg), calcium (Ca), or compound salts, such as ammonium ($NH_4$), that is combined with at least one of chlorine (Cl), fluorine (F), iodine (I), and astatine (At). In one example of a bonding treatment consistent with the present disclosure, the solid halide containing material may be potassium fluoroborate ($KBF_4$), which can be thermally decomposed to provide a halide containing gas of boron trifluoride ($BF_3$). Potassium fluoroborate ($KBF_4$) can be employed in powder form. In some embodiments, the gas forming solid halide containing material may include potassium fluoroborate ($KBF_4$) in combination with boron carbide ($B_4C$) and graphite (C). In some examples, silicon carbide (SiC) may be substituted for the graphite. In another example, aluminum oxide ($Al_2O_3$) may be substituted for the graphite. In some embodiments, the addition of boron carbide ($B_4C$) to the potassium fluoroborate ($KBF_4$) increases the production of boron difluoride ($BF_2$) in the system, which can help to control whether the bonding process is forming iron boride (FeB) or iron-II-boride ($Fe_2B$) in the surface of the metal work piece 10 being treated. The internal tubing in the reactor chamber 15 may be composed of boron carbide ($B_4C$), while the external tubing is composed of high nickel chrome stainless steel. This facilitates the production of boron difluoride ($BF_2$) in the system that may in some percentage of concentration convert back to boron trifluoride ($BF_3$) and boron difluoride ($BF_2$).

In one example, the gas forming halide containing solid material may include 100% potassium fluoroborate ($KBF_4$). In another example, a blended compound may be employed including 3% to 75% potassium fluoroborate ($KBF_4$), 10% to 50% boron carbide ($B_4C$), and 5% to 6% graphite. In another example, the gas forming solid halide material may include 10% to 35% potassium fluoroborate ($KBF_4$), 10% to 40% boron carbide ($B_4C$), and 15% to 55% graphite. In yet another example, the gas forming halide containing solid material may include 7% to 20% potassium fluoroborate ($KBF_4$), 25% to 35% boron carbide ($B_4C$), and 45% to 55% graphite. In some embodiments, the potassium fluoroborate ($KBF_4$), the boron carbide ($B_4C$) and the graphite (C) may be blended in an inert atmosphere, such as argon (Ar).

In the following description, the gas forming solid halide containing material including potassium fluoroborate ($KBF_4$) is positioned within the first treatment gas producing chamber 20, but the present disclosure is not limited to only this scenario. The solid halide containing material may be present in any of the treatment gas forming chambers 20, 25, 30, 35. Further, the second treatment gas producing chamber 25, third treatment gas producing chamber 30 and the fourth treatment gas producing chamber 35 may be used to produce other reaction gasses to be applied to the metal work piece 10 in combination with the boronizing gasses produced by the first treatment gas producing chamber 20 for multi-component boriding surface treatments including boroaluminizing, borosiliconizing, borochromizing, borovanadizing, borochromvanadizing, borotitanizing, borozirconizing, borohafniuizing, boroniobiumizing, borotanalumizing, boromolybdeniumizing, borotunstenizing, borocobalizing, boronickelizing and combinations thereof, as will be further described below.

The first treatment gas producing chamber 20 is typically separated from the reaction chamber 15 by a closable valve assembly 45a to allow for the solid halide containing material, e.g., potassium fluoroborate ($KBF_4$), to be thermally decomposed into a halide containing gas, e.g., boron trifluoride ($BF_3$), only within the treatment gas producing chamber 20. Once the halide containing gas is formed within the first treatment gas producing chamber 20, the valve assembly 20 is opened, and the halide containing gas, e.g., boron trifluoride ($BF_3$), is then introduced to the reaction chamber 15 to react with the boron containing solid form 50 to provide the boriding gas, e.g., boron difluoride ($BF_2$). Following treatment, the reaction gasses are removed from the system by a series of exhaust outlets and scrubbers. By decomposing the solid halide containing material in the first treatment gas production chamber 20 to provide the halide containing gas, e.g., boron trifluoride ($BF_3$), the methods and structures disclosed herein can eliminate the requirement of storing a dangerous and/or poisonous gas. Prior methods of gas borizing and/or plasma boronizing typically employ compressed boron trifluoride ($BF_3$) gas cylinders, which are dangerous and/or poisonous gas. Other dangerous gasses used prior to the present disclosure include $BCl_3$, diborane ($B_2H_6$), $BBr_3$ and $BI_3$. Therefore, in order to run a gas and/or plasma boronizing apparatus, boron trifluoride ($BF_3$) gas has to be stored for use. The methods and structures disclosed herein can eliminate the requirement that boron trifluoride ($BF_3$) gas be stored and employed as the starting gas for the boronizing process. Potassium fluoroborate ($KBF_4$) as used as the starting material for the boriding methods disclosed herein is not a deadly or poisonous gas.

Following the positioning of the assembly including the boron containing solid form 50 and the metal work piece 10, e.g., knife, within the reactor chamber 15, and following the positioning of the gas forming solid halide containing material, e.g., potassium fluoroborate ($KBF_4$), within the first treatment gas producing chamber 20, the reactor chamber 15 and the first treatment gas producing chamber 20 may be heated at step 150 of the process flow depicted in FIG. 3. The temperature of the first treatment gas producing chamber 20 is heated at step 150 to decompose the gas forming halide containing solid material, e.g., potassium fluoroborate ($KBF_4$). The temperature of the reactor chamber 15 is heated at step 150 to increase the temperature of the boron containing solid form 50, e.g., boron containing solid form 50 composed of boron carbide ($B_4C$), towards a temperature that is suitable for reaction with the halide containing gas, e.g., boron trifluoride ($BF_3$), that is produced by thermally decomposing the solid halide containing material, e.g., potassium fluoroborate ($KBF_4$). The temperature of the reactor chamber 15 is also heated to increase the temperature of the metal work piece 10, e.g., knife, towards a temperature suitable for diffusion of boron (B) from the boriding gas into the surface of the metal work piece 10. In some embodiments, the surface of the metal work piece 10 is to be cleaned of any surface oxide before being exposed to the boriding agent, i.e., boron difluoride ($BF_2$). This can be achieved by pulling a vacuum on the reactor chamber 15 using the vacuum assembly 70 that is depicted in FIG. 1. The vacuum applied to the reactor chamber 15 may range from $10^{-3}$ torr to $10^{-6}$ ton. Thereafter, the reactor chamber 15 containing the assembly of the boron containing solid form 50 and the metal work piece 10 may be filled with argon (Ar) and hydrogen (H) gas, which removes oxides from the surface of the metal work piece 10.

In one embodiment, at step 150 of the process flow depicted in FIG. 3, the at least the first treatment gas producing chamber 20 is heated to a temperature that is greater than the thermal decomposition temperature of the gas forming solid halide containing material, e.g., potassium fluoroborate ($KBF_4$). Thermally decomposing potassium fluoroborate ($KBF_4$) produces boron trifluoride ($BF_3$) and potassium fluoride (KF) gas, as follows:

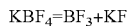

For example, the thermal decomposition temperature of potassium fluoroborate ($KBF_4$) is about 985° F. to 1058° F. (~530° C. to ~570° C.). Complete decomposition of potassium fluoroborate ($KBF_4$) is at a temperature of about 1292° F. (700° C.). In another embodiment, to thermally decompose potassium fluoroborate ($KBF_4$), the temperature of the first reaction gas production chamber 20 containing the potassium fluoroborate ($KBF_4$) is increased to greater than 1140° F. (~615° C.). Although potassium fluoroborate ($KBF_4$) decomposes at temperatures starting at 985° F., it has been found that in some embodiments, sufficient volumes of boron trifluoride ($BF_3$) for reaction with the boron containing solid form 50, e.g., a boron containing solid form of boron carbide ($B_4C$), are not available until the temperature of the first treatment gas producing chamber 20 is at 1550° F. (850° C.) or greater.

In some embodiments, when the temperature of the first reaction gas producing chamber 20 reaches about 1250° F. (660° C.), the valve assembly 45a separating the first treatment gas producing chamber 20 from the reactor chamber 15 is opened. This provides that the halide containing gas, e.g., boron trifluoride ($BF_3$), that is formed in the first treatment gas producing chamber 20, e.g., via thermal decomposition of potassium fluoroborate ($KBF_4$), can be moved from the treatment gas producing chamber 20 to the reactor chamber 15.

Still referring to step 150 of the process flow depicted in FIG. 3, while the first treatment gas producing chamber 20 is heated to decompose the halide containing solid material, e.g., potassium fluoroborate ($KBF_4$), the reactor chamber 15 is heated towards a temperature that is suitable for bonding. More specifically, in some embodiments, the temperature of the reactor chamber 15 during step 150 is increased so that when the valve assembly 45a between the reactor chamber 15 and the first treatment gas producing chamber 20 is opened, the temperature of the boron containing solid form 50 is suitable for reaction with the halide containing gas. The reaction of the halide containing gas, e.g., boron trifluoride gas ($BF_3$), and the boron containing solid form 50, e.g., boron containing solid foam 50 composed of boron carbide ($B_4C$), produces the gas for boriding the metal work piece 10, e.g., boron difluoride ($BF_2$). Further, the temperature of the reactor chamber 15 is heated to increase the temperature of the metal work piece 10 to promote diffusion of the boron (B) into the surface of the metal work piece 10 from the bonding gas, e.g., boron difluoride ($BF_2$).

During step 150 of the process flow depicted in FIG. 3, the temperature of the reactor chamber 15 is increased to about 1250° F. (660° C.) before the valve assembly 45a that is separating the reactor chamber 15 from the first treatment gas producing chamber 20 is opened. In one embodiment, the rate at which the temperature is increased in the reactor chamber 15 and the first treatment gas producing chamber 20 may range from 200° F. (93° C.) per hour to 300° F. (150° C.) per hour. In another embodiment, the rate at which the temperature is increased in the reactor chamber 15 and the first treatment gas producing chamber 20 may range from 225° F. (107° C.) per hour to 275° F. (135° C.) per hour.

In some embodiments, after the valve assembly 45a that is separating the first treatment gas producing chamber 20 from the reactor chamber 15 is opened, the temperature of the first treatment gas producing chamber 20 and the temperature of reactor chamber 15 are increased to move the halide containing gas, e.g., boron trifluoride ($BF_3$), from the first treatment gas producing chamber 20 to the reactor chamber 15 at step 160 of the process flow depicted in FIG. 3. More specifically, in some embodiments, to move the halide containing gas, e.g., boron trifluoride ($BF_3$), from the first treatment gas producing chamber 20 to the reactor chamber 15, the temperature of the first treatment gas producing chamber 20 is increased to be greater than the temperature of the reactor chamber 15. By introducing a temperature gradient between the first reaction gas producing chamber 20 and the reactor chamber 15 the halide containing gas, e.g., boron trifluoride ($BF_3$), is moved to the reactor chamber 15 by a heat flow mechanism. The term "heat flow" denotes the transfer of thermal energy from a region having a higher temperature to a region having a lower temperature.

In one embodiment, to move the halide containing gas, e.g., boron trifluoride ($BF_3$), from the first treatment gas producing chamber 20 to the reactor chamber 15, the temperature of the first treatment gas producing chamber 20 is increased to be greater than 50° F. higher than the reactor chamber 15. In one embodiment, to move the halide containing gas, e.g., boron trifluoride ($BF_3$), from the first treatment gas producing chamber 20 to the reactor chamber 15, the temperature of the first treatment gas producing chamber 20 is increased to be greater than 100° F. higher than the reactor chamber 15. In one example, to move the halide containing gas, e.g., boron trifluoride ($BF_3$), from the first treatment gas producing chamber 20 to the reactor chamber 15, the temperature of the first treatment gas producing chamber 20 is increased to be within the range of 50° F. to 300° F. greater than the reactor chamber 15. In another example, to move the halide containing gas, e.g., boron trifluoride ($BF_3$), from the first treatment gas producing chamber 20 to the reactor chamber 15, the temperature of the first treatment gas producing chamber 20 is increased to be within the range of 100° F. to 200° F. greater than the reactor chamber 15.

The temperature of the reactor chamber 15 is typically selected to promote that the halide containing gas, e.g., boron trifluoride ($BF_3$), reacts with the boron containing solid form 50 to produce the gas for boriding the metal work piece 10, e.g., boron difluoride ($BF_2$). In one embodiment, the reaction between the boron containing solid form 50 of boron carbide ($B_4C$), and the halide containing gas of boron trifluoride ($BF_3$) is as follows:

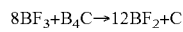

$$8BF_3 + B_4C \rightarrow 12BF_2 + C$$

The temperature of the reactor chamber 15 is also selected to promote diffusion of boron from the boriding gas, e.g., boron difluoride ($BF_2$), into the metal work piece 10 when the metal work piece 10 is contacted by the boriding gas. For example, diffusion of the boron (B) into the metal work piece, such as a knife composed of low carbon steel, produces boron containing compounds, i.e., borides, such as iron borides including FeB and/or $Fe_2B$. Typically, the boriding, e.g., diffusion of boron (B) into the metal work piece 10 to form metal borides at a surface region of the metal work piece, takes place at temperatures between approximately 850° C. and 950° C. (1560° F. and 1740° F.).

In some embodiments, at step 160 of the process flow depicted in FIG. 3, the temperature of the reactor chamber 15 and the first treatment gas producing chamber 20 is increased to a temperature within the range of 1750° F. (955° C.) to 1900° F. (1023° C.), wherein a difference between the temperature of the reactor chamber 15 and the first treatment gas producing chamber 20 moves the halide containing gas, e.g., boron trifluoride ($BF_3$), to the reactor chamber 15. In another embodiment, the temperature of the reactor chamber 15 and the first reaction gas producing chamber 20 is increased to a temperature within the range of 1800° F. (982° C.) to 1875° F. (1023° C.).

There may also be an increase in rate that the temperature is increased for the first treatment gas producing chamber 20 and the reactor chamber 15 during step 160 of the process flow depicted in FIG. 3. For example, during step 160 of the process flow depicted in FIG. 3, the rate at which the temperature is increased in the reactor chamber 15 and the first treatment gas producing chamber 20 may range from 100° F. (37° C.) per hour to 1000° F. (537° C.) per hour. In another embodiment, the rate at which the temperature is increased in the reactor chamber 15 and the first treatment gas producing chamber 20 may range from 200° F. (93° C.) per hour to 500° F. (260° C.) per hour.

In one embodiment, the different in temperature between the reactor chamber 15 and the first treatment gas producing chamber 20 during step 160 of the process flow depicted in FIG. 3 is maintained for a period of 5 minutes to 25 minutes. In another embodiment, the different in temperature between the reactor chamber 15 and the first treatment gas producing chamber 20 is maintained for a period of 10 minutes to 20 minutes. In one example, the different in temperature between the reactor chamber 15 and the first treatment gas producing chamber 20 is maintained for a period of 15 minutes.

At step 170 of the process flow depicted in FIG. 3, the temperature of the first treatment gas producing chamber 20 is reduced to be substantially equal to the temperature of the reactor chamber 15, and to provide equilibrium between the first treatment gas producing chamber 20 and the reactor chamber 15. By providing an equilibrium between the first treatment gas producing chamber 20 and the reactor chamber 15, uniformity of the bonding treatment to the metal work piece 10 may be enhanced. In some embodiments, the temperature of the first reaction gas producing chamber 20 and the temperature of the reactor chamber 15 is selected to provide for optimum boronizing in the reactor chamber 15. For example, the temperature of the reactor chamber 15 and the first treatment gas producing chamber 20 at step 170 of the process flow depicted in FIG. 3 may range from 1700° F. (~925° C.) to 1900° F. (~1025° C.). In another example, the temperature of the reactor chamber 15 and the first reaction gas producing chamber 20 at step 170 of the process flow depicted in FIG. 3 may range from 1800° F. (~980° C.) to 1875° F. (~1020° C.).

The time period that the temperature is maintained in the first treatment gas producing chamber 20 and the reactor chamber 15 during step 170 of the process flow depicted in FIG. 3 may range from 1 hour to 24 hours. In another embodiment, the time period that the temperature is maintained in the first treatment gas producing chamber 20 and the reactor chamber 15 during step 170 of the process flow depicted in FIG. 3 may range from 4 hour to 20 hours. It is noted that other temperatures and treatment times have been contemplated for steps 150, 160 and 170 of the process flow that is depicted in FIG. 3.

At step 180 the reactor chamber 15 is cooled room temperature to remove the bonded metal work piece 10. Because the metal work piece 10 has been bonded without direct contact with a physical bonding agent, such as a boron containing powder or frit, the metal work piece 10 will not require cleaning to remove bonding agents from the surface of the metal work piece 10.

In the treatment of metal parts, chemicals other than boron (B) may be desirably diffused into the surface of the metal work piece 10. In some embodiments, the bonding apparatus 100 that is depicted in FIG. 1 may be employed in a multi-component boriding process. The term "multi-component boriding" refers to multiple treatments of thermochemical diffusion into a metal work piece 10 that includes boron (B) for boronizing with at least one other element to be introduced to the metal work piece 10 by thermochemical diffusion. In this embodiment, boronizing is only one step in the process. Some common multi-component surfaces treatments include at least one of boroaluminizing, borosiliconizing, borochromizing, borovanadizing, and borochromvanadizing.

Boroaluminizing is a metal surface treatment, e.g., thermochemical diffusion process, where both boron (B) and aluminum (Al) are diffused into the surface of a metal work piece 10, such as an iron (Fe) containing metal work piece, e.g., steel. In some examples, boroaluminizing provides a surface having improved oxidizing resistance in wet conditions, when compared to the performance of the base material prior to boroaluminizing Borosiliconizing is a metal surface treatment, e.g., thermochemical diffusion process, where both boron (B) and silicon (Si) are diffused into the surface of a metal work piece 10, such as an iron (Fe) containing metal work piece 10, e.g., steel. In some examples, the borosiliconizing provides a surface having improved corrosion fatigue strength, when compared to the performance of the base material prior to borosiliconizing. Borochromizing is a metal surface treatment, e.g., thermochemical diffusion process, where both boron (B) and chromium (Cr) are diffused into the surface of the metal work piece 10, such as an iron (Fe) containing metal work piece 10, e.g., steel. In some examples, the borochromizing provides a surface with better oxidizing resistance than boroaluminizing at elevated temperatures, preferably resulting in a very uniform layer and improves wear resistance beyond that of boron alone.

Borovanadizing is a metal surface treatment, e.g., thermochemical diffusion process, where both boron (B) and vanadium (V) are diffused into the surface of the metal work piece 10, such as an iron (Fe) containing metal work piece 10, e.g., steel. In some examples, the boronvanadized surface has a high hardness, when compared to the base metal prior to being borovanadized, but with higher ductility and toughness, thereby reducing spalling under impact applications. Borochromvanadizing is a metal surface treatment, e.g., thermochemical diffusion process, where boron (B), chromium (Cr) and vanadium (V) are diffused into the surface of the metal work piece 10, such as an iron (Fe) containing metal work piece 10, e.g., steel. In some examples, the boronchromvanadizing provides a high level of hardness and provide corrosion resistance against most acids.

The multi-component surface treatment applied to the metal work piece 10 by the boriding apparatus 100 may differ depending on the ultimate use of the metal work piece 10. For example, for metal knives used to cut wood into chips for use in the manufacture of pulp, a knife made using borovanadizing process may have a long life. In some embodiments, the boriding apparatus 100 can employ multiple treatment steps to be applied to the metal work piece 10 simultaneously. For example, boronizing, carburizing, and the application of a ceramic coating for corrosion resistance may be applied in a single treatment step using the boriding apparatus 100 that is depicted in FIG. 1.

In one embodiment, a multi-component surface treatment process may begin with loading metal work pieces 10 into the reactor chamber 15 (also referred to as a treatment vessel) of the boriding apparatus 100. The above description of the metal work pieces 10 and the process flow for loading the metal work pieces 10 into the reactor chamber 15 that is made with reference to steps 110, 120 and 130 of the process flow depicted in FIG. 3, are suitable for describing the loading the metal work pieces 10 into the reactor chamber 15 of the multi-component surface treatment process. Following loading of the metal work pieces 10 into the boriding apparatus 100, a vacuum, e.g., ranging from $10^{-3}$ torr to $10^{-10}$ torr, is created in the reactor chamber 15 to evacuate sufficient oxygen. By evacuating oxygen from the reactor chamber 15, the presence of an oxide layer that could impede the surface treatment is substantially eliminated.

In some examples, the carburizing treatment is applied to the metal work piece 10 prior to the boriding treatments. For example, when carburizing is used as a method to produce a foundation transition zone separating the base metal of the metal work piece 10 and the hard diffused layers engineered on the surface of the metal work piece 10, the carburizing step becomes the first step prior to the boronizing step. Alcohol and carbon is available in powder form. The carbon and alcohol powder is not the only starting materials to provide the gas for carburization. For example, carburization can be provided using methane ($CH_4$) gas.

In one embodiment, the reactants that are loaded into the second treatment gas producing chamber 25 include a carbon source, such as carbon black, activated carbon, or charcoal in powder form and/or a gas such as acetylene, map, propane, propylene, carbon monoxide, ethylene, methane and combinations thereof.

One embodiment of carburizing is produced by pulling a vacuum in the reactor chamber 15 in the initial phase, and backfilling the reactor chamber 15 with argon/hydrogen. Following backfilling, the pull down step may reduce the chamber of the reactor chamber to a pressure ranging from 1 Torr to 20 Torr, which is maintained during the carburization step. Carbon can then be delivered to the metal part by use of acetylene in the equation:

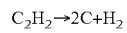

$$C_2H_2 \rightarrow 2C+H_2$$

Carbon can also be delivered to the metal work piece 10 with the use of carbon powder and butyl alcohol so that the surface carbon potential is greater than 1%. The addition of a metal salt halide to the carbon powder alcohol blend creates a tert-butoxide halide, which responds well for the use of thermochemical diffusion of carbon in metal. In some examples, the addition of the butyl alcohol will inhibit the accumulation of "soot" in the reaction area. In some embodiments, in which atmospheric carburization is employed, an endothermic atmosphere is created having 40% hydrogen, 40% nitrogen, and 20% carbon monoxide. At carburizing temperature, the addition to the endothermic atmosphere of methane and propane is added to the second treatment gas producing chamber 25 to create a carbon rich boost atmosphere.

The second treatment gas producing chamber 25 containing carbon and alcohol may be heated to a temperature ranging from 1550° F. (8430° C.) to 1724° F. (940° C.), e.g., 860° C. (1580° F.), while the vacuum is being applied to the reactor chamber 15. The reactor chamber 15 may be heated to about 1580° F. (860° C.). In one embodiment, once the reactor chamber 15 is at a vacuum, the reactor chamber 15 may be back filled with an inert gas mixture. In one example, the back filling of the reactor chamber 15 with the inert gas mixture includes argon (Ar) and hydrogen (H) in a ratio of 98% argon and 2% hydrogen, at a flow rate of between 5 standard cu ft/hr and 100 standard cu ft/hr. The partial pressure of the reaction chamber 15 may be at about 1 Torr to 20 Torr for carburizing, and at about atmospheric pressure (about 14.7 psi) for any additional diffusion.

The hot carbon and alcohol gas from the second treatment gas producing chamber 25 may then be allowed to enter the reactor chamber 15. More specifically, the valve 45b separating the second treatment gas producing chamber 25 from the manifold 65 is opened providing a continuous flow path between the second treatment gas producing chamber 25 and the reactor chamber 15. In one embodiment, the reaction period for the hot carbon and alcohol gas may range from 15 minutes to 90 minutes. In another embodiment, the reaction period for the hot carbon and alcohol gas may range from 45 minutes to 75 minutes. In yet another embodiment, the reaction period for the hot carbon and alcohol gas may range from 55 minutes to 65 minutes. In an even further embodiment, the reaction period can be 15 minutes to 30 hours.

Following the carburizing treatment, the reactor chamber 15 may be purged. For example, the reactor chamber 15 may be purged with a flow of argon/hydrogen gas. The flow of the argon/hydrogen gas may be continuous, but it may also be increased, decreased or maintained based on the cycle of the surface treatment. When purging the reactor chamber 15, it may be preferable to increase flow and pressure. In some embodiments, the flow of the argon/hydrogen gas may be selected to dictate the time that a reactive gas, such as a carburizing gasses, is present within the reaction chamber 15, which may be referred to as the reaction period.

For example, once the reactor chamber 15 has held the hot carbon and alcohol gas for the desired time, the valve assembly 45b connecting the second treatment gas producing chamber 25 to the manifold 65 to the reactor chamber 15 may be closed, which stops the flow the hot carbon and alcohol gas from entering the reactor chamber 15. The flow of argon and hydrogen gas may then be increased, e.g., to a rate of 10 standard cu ft/hr, to purge the reactor chamber 15. The time period for purging the reactor chamber 15 with the argon and hydrogen gas may be on the order of 5 minutes.

In some embodiments, after purging of the reactor chamber 15 with the argon and hydrogen mixture, the flow of the argon and hydrogen as mixture can be stopped, and the temperature of the reactor chamber 15 may be raised from to be within the range of about 1616° F. (880° C.) to about 1715° F. (935° C.). In one example, the temperature of the reactor chamber 15 may be raised from to be within the range of 1679° F. (915° C.) to 1715° F. (935° C.).

Following carburizing, a first boronizing step is performed. The halide containing solid materials that are loaded in the first treatment gas producing chamber 20 for the multi-component surface treatment process are similar to the halide containing solid materials, e.g., potassium fluoroborate ($KBF_4$), that are loaded into the first treatment gas producing chamber 20 at step 140 of the process flow depicted in FIG. 3. For example, the boriding chemicals loaded into the first reaction gas producing chamber 20 may include a mixture of potassium fluoroborate ($KBF_4$), boron carbide ($B_4C$), iron (Fe) and graphite (C). In one embodiment, the first treatment gas producing chamber 20 is loaded with halide containing solid materials suitable for producing a halide containing gas for reaction with the boron containing solid for 50 to provide the gas for boriding the metal work piece 10.

Typically, the reactive gas from the first treatment gas producing chamber is applied to the metal work piece 10 after the carburizing step has been completed. The first treatment gas producing chamber 20 containing the boriding chemicals, such as potassium fluoroborate ($KBF_4$), boron carbide ($B_4C$), iron (Fe) and graphite (C), may be heated to a temperature ranging from 1724° F. (940° C.) to 1760° F. (960° C.), e.g., 1742° F. (950° C.), while the reactor chamber 15 may be heated to about 1660° F. (880° C.). The speed in which the replacement iron (Fe) molecules are capable of reaching the surface may not be proportional to the speed of reaction. While the reactor chamber 15 is at a temperature of about 1660° F. (880° C.), the flow rate of the argon/hydrogen mixture may be reduced to about 2 standard cu ft/hr. In some embodiments, once the argon/hydrogen mixture is reduced to about 2 standard cu ft/hr, the valve assembly 45a separating the first treatment gas producing chamber 20 from the manifold 65 is opened.

In some embodiments, while the hot carbon and alcohol gas from the second treatment gas producing chamber 25, or the boronizing gas from the first treatment gas producing chamber 20, is fed to the reactor chamber 15, a third treatment gas producing chamber 30 containing ferrovanadium (FeV), aluminum oxide ($Al_2O_3$) and ammonia chloride ($NH_4Cl$) may be heated to a temperature ranging from about 1832° F. (1000° C.) to 1868° F. (1020° C.). In one example, the temperature of the third treatment gas producing chamber 30 is 1850° F. (1010° C.).

Once the reactor chamber 15 reaches the desired temperature, e.g., about 1697° F. (925° C.), boriding chemicals, e.g., decomposed potassium fluoroborate ($KBF_4$), from the first treatment gas producing chamber 20 may be allowed to flow into the reactor chamber 15. More specifically, boron trifluoride ($BF_3$) from the decomposed potassium fluoroborate ($KBF_4$) is moved from the first treatment gas producing chamber 20 to react with the boron carbon ($B_4C$) of boron containing solid form 50 to provide a boriding gas, i.e., boron difluoride ($BF_2$), within the reactor chamber 15. In some embodiments, because the boriding chemicals may be at a temperature higher than the reactor chamber 15, the boriding chemicals, e.g., boron difluoride ($BF_2$), may condense onto the surface of the metal work piece 10. For example, the boriding chemicals within the first treatment gas producing chamber 20, e.g., decomposed potassium fluoroborate ($KBF_4$), may be at a temperature of about 1742° F. (950° C.), while the temperature of the reactor chamber 15 and the metal work piece 10 is at a temperature of about 1697° F. (925° C.).

In one embodiment, the difference in temperature between the first treatment gas producing chamber 20 and the reactor chamber 15 is maintained for about 5 minutes or less. In one example, the difference in temperature between the first treatment gas producing chamber 20 and the reactor chamber 15 is maintained for 3 minutes. After the time period that the temperature of the first treatment gas producing chamber 20 is different from the temperature of the reactor chamber 15 to move the products from the decomposed potassium fluoroborate ($KBF_4$) to the reactor chamber 15, the temperature of the first treatment gas producing chamber 20 may be cooled to be equal to the temperature of the reactor chamber 15. For example, when the reactor chamber 15 is at a temperature of about 1697° F. (925° C.), the temperature of the first treatment gas producing chamber 20 may be reduced to about 1697° F. (925° C.).

Once the temperature of the first treatment gas producing chamber 20 containing the bonding chemicals is at a temperature about equal to the temperature of the reactor chamber 15, the bonding chemicals from the first treatment gas producing chamber 20 may remain in the reactor chamber 15 for a period of time to allow for sufficient bonding reactions to occur on the metal work piece 10. In one embodiment, the time period for the bonding reactions may range from 60 minutes to 120 minutes after the bonding chemicals from the first treatment gas producing chamber 20 have stop flowing to the reactor chamber 15. In another embodiment, the time period for the bonding reaction may range from 75 minutes to 100 minutes. In yet another embodiment, the time period for the bonding reaction may range from 85 minutes to 95 minutes. In one example, the time period for the bonding reaction may be 90 minutes. The bonding process for the multi-component surface treatment process is similar to the bonding process that is described with reference to steps 140, 150, 160 and 170 of the process flow illustrated in FIG. 3. Therefore, further details on the production of the bonding gas and the bonding reactions for the multi-component surface treatment process can be found in the above description of steps 140, 150, 160 and 170 of the process flow depicted in FIG. 3.

Once flow of the bonding chemicals from the first treatment gas producing chamber 20 has stopped, the flow of argon and hydrogen gas may again be introduced to the reactor chamber 15 to purge the vessel, e.g., at a flow rate of 10 standard cu ft/hr for about 5 minutes.

In some embodiments, while the hot carbon and alcohol gas from the second treatment gas producing chamber 25, or the bonding chemicals from the first gas producing chamber 20, is fed to the reactor chamber 15, a third treatment gas producing chamber 30 containing ferrovanadium (FeV), aluminum oxide ($Al_2O_3$) and ammonia chloride ($NH_4Cl$) may be heated to a temperature ranging from about 1832° F. (1000° C.) to 1868° F. (1020° C.). In one example, the temperature of the third treatment gas producing chamber 30 is 1850° F. (1010° C.).

After the reactor chamber 15 is purged of the boriding chemicals, the temperature of the reactor chamber 15 may be increased to temperature ranging from 1832° F. (1000° C.) to 1868° F. (1020° C.), e.g., 1850° F. (1010° C.), in preparation of receiving the chemicals from a third treatment gas producing chamber 30.

In one embodiment, while the reactor chamber 15 is heating to the desired temperature ranging from 1832° F. (1000° C.) to 1868° F. (1020° C.), e.g., 1850° F. (1010° C.), the fourth reaction gas producing chamber 35 containing a mixture of chemicals, such as chrome (Cr), nickel (Ni) and boron (B), as well as rare earth elements, such as cerium oxide ($CeO_2$) and/or neodymium oxide ($NdO_2$), may be heated to a temperature ranging from 1562° F. (850° C.) to 1700° F. (925° C.), e.g., about 1650° F. (898° C.). In another embodiment, while the reactor chamber 15 is heating to the desired temperature ranging from 1832° F. (1000° C.) to 1868° F. (1020° C.), e.g., 1850° F. (1010° C.), the fourth reaction gas producing chamber 35 containing a mixture of chemicals, such as chrome (Cr), nickel (Ni) and boron (B), may be heated to a temperature ranging from 830° C. to 900° C. ° C. In another embodiment, while the reactor chamber 15 is heating to the desired temperature ranging from 1832° F. (1000° C.) to 1868° F. (1020° C.), e.g., 1850° F. (1010° C.), the fourth treatment gas producing chamber 35 containing a mixture of chemicals, such as chrome (Cr), nickel (Ni) and boron (B), may be heated to a temperature ranging from 1598° F. (870° C.) to 1634° F. ° F. (890° C.).

Once the reactor chamber 15 has been purged and heated to the desired temperature ranging from 1832° F. (1000° C.) to 1868° F. (1020° C.), e.g., 1850° F. (1010° C.), the flow rate of the argon and hydrogen gas mixture from the first treatment gas producing chamber 20 may be reduced to 2 standard cu ft/hr, while a flow of reactant chemicals, e.g., ferrovanadium (FeV), aluminum oxide ($Al_2O_3$) and ammonia chloride ($NH_4Cl$), from the third treatment gas producing chamber 30 may flow into the reactor chamber 15 for a period of time to allow for the vanadizing reactions to occur. To allow for reactant chemicals to flow from the third treatment gas producing chamber 30 to the reactor chamber 15, the valve assembly 45c between the third treatment gas producing chamber 30 and the manifold 65 to the reactor chamber 15 is opened. In one embodiment, the period of time that the reactant chemicals are present in the reactor chamber 15 for vanadizing may range from 30 minutes to 60 minutes. In another embodiment, the period of time that the reactant chemicals are present in the reactor chamber 15 for vanadizing the metal work piece 10 may range from 35 minutes to 55 minutes. In one example, the period of time that the reactant chemicals are present in the reactor chamber 15 for vanadizing the metal work piece 10 may be 45 minutes.

Upon completion of the vanadizing reactions, flow of the vanadizing reactant gas from the third treatment gas producing chamber 30 is stopped and the reactor chamber 15 may be allowed to cool by the inflow of an inert gas, such as argon (Ar) or a blend of argon (Ar) and hydrogen (H). For example, the valve assembly 45c, between the third treatment gas producing chamber 30 and the manifold 65 to the reactor chamber 15 may be closed, and the temperature of the reactor chamber 15 may be cooled to about 1598° F. (870° C.). In one embodiment, once the reactor chamber 15 is cooled to about 1598° F. (870° C. ° C.), purge gas of argon and hydrogen may flow to the reactor chamber 15 for sufficient time to purge the reactor chamber 15 of the vanadizing reactant gas. In one embodiment, the time to purge the reactor chamber 15 of the vanadizing reactant gas may be on the order of 5 minutes.

Following cooling of the reactor chamber 15 to about 1598° F. (870° C.), and purging of the reactor vessel 15 of vanadizing reactant gas, reactant gas from the fourth treatment gas producing chamber 35, e.g., reactant gas of chrome (Cr), nickel (Ni) and boron (B), as well as rare earth elements, such as cerium oxide ($CeO_2$) and/or neodymium oxide ($NdO_2$), may flow into the reactor chamber 15. To flow the reactant gas from the fourth treatment gas producing chamber 35 to the reactor chamber 15, the valve assembly 45d between the fourth treatment gas producing chamber 35 and the manifold 65 to the reactor chamber 15 is opened. The reactant gas from the fourth reaction gas producing chamber 35 may be flowed to the reactor chamber 15 for a time period on the order of about 30 minutes. In some embodiments, shortly after flow begins from the fourth treatment gas producing chamber 35, air may be introduced into the fourth treatment gas producing chamber 35 and may flow along with the reactant gas from the fourth treatment gas producing chamber 35 into the reactor chamber 15. Once the flow of reactant gas from the fourth treatment gas producing chamber 35 has been stopped, the flow of argon and hydrogen as purge gas may be again increased to about 10 standard cu ft/hr and the reactor chamber 15 may be allowed to cool to room temperature.

In some embodiments, once the temperature of the reactor chamber 15 and the temperature of the metal work piece 10 within the reactor chamber 15 reaches room temperature, e.g., 77° F. (25° C.), the reactor chamber 15 may be again heated to allow the metal work pieces 10 to be tempered. In one example, a first tempering cycle may include a temperature within a range of 302° F. (150° C.) to 392° F. (200° C.), e.g., 347° F. (175° C.), for a treatment period having a time ranging from 45 minutes to 75 minutes, e.g., 60 minutes. At the end of the first tempering cycle, the metal work pieces 10 may be again allowed to cool to room temperature followed by raising the temperature of the reactor chamber 15 to about 347° F. (175° C.) for a time period of about 1 hour to allow for tempering of the metal work pieces 10 in a second cycle. In some embodiments, after at least two cycles of tempering, the metal work pieces 10 may be heated treated in either within the reactor chamber 15, or in separate equipment. Heat treating of the metal work pieces 10 may be carried out in a vacuum of 1 micron of mercury and quenched in argon or nitrogen.

The multi-component surface treatment process described above may relate to the diffusion of carbon (C), boron (B), chromium (Cr), rare earth elements, vanadium (V), and chromium monoxide chemicals. Various proportions may be chosen for every application. For example, the above disclosed times and temperatures are typically for the treatment of knives, as an example. Because there are many applications that are suitable for use with the above described methods and structures, the above described times and temperatures may be increased or decreased depending upon the application of the metal work piece 10, and the composition of the base metal of the metal work piece 10, as well as the solution of wear and/or corrosion for the type of part treated. Further, the treatment steps of the multi-component surface treatment process may be interchangeable. In one example, the sequence could be: (1) carburizing, (2) borovanadizing with simultaneous borochromizing, which may be followed by the application of chrome oxide. In another example, the sequence could be: (1) borochromizing, (2) boronizing, and (3) borovanadizing, which may be followed by the application of chrome oxide. Additionally, it is noted that the above examples are provided for illustrative purposes only, and that other initial, intermediate, and final process steps not specifically disclosed above are within the scope of the present disclosure. For example, other elements, such as titanium (Ti), hafnium (Hf), and tungsten (W), may be substituted for chrome (Cr) in borochromizing.

Figure 4:
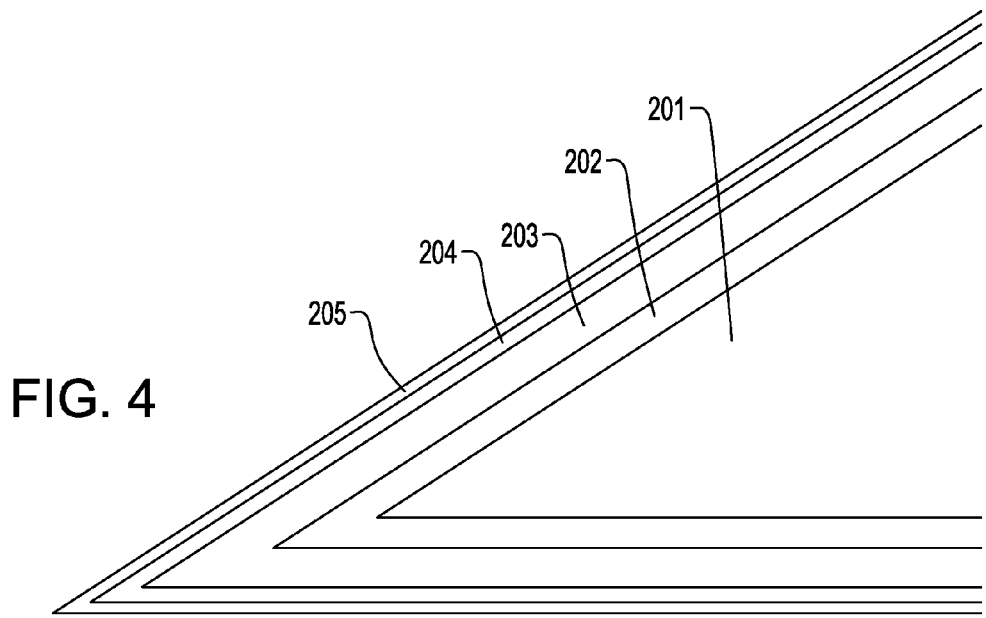
FIG. 4 is a side cross-sectional view of one embodiment of a metal work piece that has been borided, in accordance with the present disclosure.

FIG. 4 illustrates a cross sectional view of one embodiment of a metal work piece 10 treated in accordance with the above described multi-component surface treatment process. In the embodiment, that is depicted in FIG. 4, the metal work piece is a metal knife that is used to cut wood into chips for use in the manufacture of pulp. The cross-section depicted in FIG. 4 is the cross-section of the tip of the metal knife. In one example, 50% of the area of the cross-section for the treated metal work piece may be a core 200 of the base metal for the metal work piece. Typically, the base metal for the metal work piece is a low carbon steel, e.g. a tool steel with a medium carbon content ranging from 0.4% to 0.6%. The outermost corrosion layer 204 may represent 2% to 3% of the area of the cross-section for the treated metal work piece and may be composed of a chrome oxide ceramic. A vanadium boron diffused layer 203 may be 12% to 15% of the cross section for the treated metal work piece and may include diffused elements of vanadium and boron. A borochromium layer 202 may be 12% to 15% of the area of the cross-section of the tip of the treated metal work piece. A carburized layer 201 may be the remaining 15% to 17% of the area for the cross-section for the treated metal work piece.

The following examples are provided to further illustrate some aspects of the structures and methods disclosed herein. It is not intended that the present disclosure be limited to the specific examples disclosed.

EXAMPLE

A pack bonding method was performed to determine the impact of temperature on the bonding process. The metal work pieces being treated we formed from one of three metal compositions. The composition of the metal work pieces treated included AISI 1020 low carbon steel (C=0.20%, Mn=0.45%, P=0.04% max, S=0.05% max and a substantial remainder of Fe), AISI 4140 mid. alloy steel (C=0.42%, Si=0.3%, Mo=0.2%, Mn=1.0%, Cr=1.0% and a substantial remainder of Fe) and AISI 8620 high strength steel (C=0.20%, Si=0.25%, Mn=0.8%, Cr=0.5%, Mo=0.2% and a substantial remainder of Fe). The metal work pieces were bonded using a pack bonding process with a pack composition that is equal to:

55%—Asbury Graphite\ (C) Grade 4110—powder particle size+140/−200 mesh.

35%—U.K. Abrasives\ Boron Carbide ($B_4C$)—powder particle size 125/90 urn

10%—KB Alloys\ Potassium Fluoroborate ($KBF_4$)—powder particle size 10%+60 mesh, 45%-200 mesh.

The temperature of the pack bonding process was at either 1499° F. (815° C.), 1648° F. (898° C.) and 1742° F. (950° C.). The time of the bonding process was 8 hours. Following the bonding process the depth that the boron diffused into the metal work piece was measured by means of cross sectional photomicrographs examined under magnification of 50×, 100× and 400×. Treating the metal work pieces to diffuse boron into the surface of the metal work pieces using the pack bonding process with the above noted pack composition provided the following results:

TABLE 1

| Steel Type | Temperature | a. Ti | Diffusion Depth |
|---|---|---|---|
| 1020 low carbon | b. 815 | 8 Hours | 2 microns |
| 4140 mid. alloy | c. 815° C. | 8 Hours | Nothing measurable |
| 8620 high strength | d. 815° C. | 8 Hours | Nothing measurable |

TABLE 2

| Steel Type | Temperature | e. Ti | Diffusion Depth |
|---|---|---|---|
| 1020 low carbon | f. 898 | 8 Hours | 38 microns |
| 4140 mid alloy | g. 898 | 8 Hours | 22 microns |
| 8620 high strength | h. 898 | 8 Hours | 29 microns |

TABLE 3

| Steel Type | Temperature | i. Ti | Diffusion Depth |
|---|---|---|---|
| 1020 low carbon | j. 950 | 8 Hours | 203 microns |
| 4140 mid. alloy | k. 950 | 8 Hours | 170 microns |
| 8620 high strength | l. 950 | 8 Hours | 200 microns |

From Table 1, it can be seen the first measurable diffusion of boron into one of the most receptive of steels (1020 low carbon) does not occur until a temperature of 815° C., but at that temperature no measurable diffusion of boron into the other two sample metals (4140 mid. alloy steel and 8620 high strength steel) was measured. This lack of diffusion of boron into the surface of the metal work piece exists even though $BF_3$ is present and $B_4C$ is available to react to make $BF_2$, i.e., the boriding gas. It is suggested that the reaction $8BF_3 + B_4C \rightarrow 12BF_2 + C$ with the base metal is dependent on temperature requiring sufficient thermal energy to be available so meaningful depths of diffusion can take place. For example, referring to Table 2 and 3 significant diffusion depth was achieved when the diffusion process was conducted at temperatures of 898° C. and 950° C. As can be determined from the data in Tables 1, 2 and 3, the effects of temperature on the components and system can be dynamic.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A boriding treatment apparatus comprising:
a reactor chamber comprising a boron containing heating element, wherein the boron containing heating element is a component of an assembly for housing a metal work piece for treatment by the boriding treatment apparatus, the boron containing heating element being a solid form having a porosity, wherein the boron containing heating element converts electricity into heat by joule heating; and
at least one treatment gas producing chamber in communication with the reactor chamber with a passageway for transporting a reaction gas produced within the at least one treatment gas producing chamber through the boron containing heating element, wherein the reaction gas and the boron containing heating element react to provide a boronizing gas that borides the metal work piece being housed by the assembly.

2. The boriding treatment apparatus of claim 1, wherein the at least one treatment gas producing chamber that is in communication with the reactor chamber is through at least one valve assembly.

3. The boriding treatment apparatus of claim 2, wherein the at least one treatment gas producing chamber includes multiple treatment gas producing chambers, wherein communication to the reactor chamber for each of the multiple treatment gas producing chambers is through a manifold.

4. The boriding treatment apparatus of claim 3, wherein a gas line extends from the manifold to the boron containing heating element.

5. The boriding treatment apparatus of claim 1, wherein the assembly includes a body portion for housing the metal work piece, and the boron containing heating element provides the sidewall elements of the assembly that are adjacent to the body portion, wherein the boron containing heating element includes a treatment region that is positioned adjacent to a portion of the metal work piece being treated by the boriding treatment apparatus.

6. The boriding treatment apparatus of claim 5, wherein the boron containing heating element does not directly contact the metal work piece.

7. The boriding treatment apparatus of claim 6, wherein the body portion of the assembly is comprised of graphite, or silicon carbide.

8. The boriding treatment apparatus of claim 6, wherein the body portion for housing the metal work piece separates at least the treatment region of the boron containing heating element from the metal work piece by a gap that ranges from 100 microns to 20 mm.

9. The boriding treatment apparatus of claim 6, wherein the body portion for housing the metal work piece separates at least the treatment region of the boron containing heating element from the metal work piece by a gap that ranges from 1000 microns to 1 mm.

10. The boriding treatment apparatus of claim 9, wherein the assembly further comprises a cap portion that encloses the metal work piece in the cavity of the body portion and between the sidewall elements of the assembly that are provided by the boron containing heating element.

11. The boriding treatment apparatus of claim 9, wherein the profile of the cavity is substantially equal to a knife profile used in pulp manufacture.

12. The boriding treatment apparatus of claim 5, wherein the body portion of the assembly comprises a cavity present therein having a profile that matches a profile of the metal work piece being housed within the assembly.

13. The boriding treatment apparatus of claim 5, wherein the treatment region is a notch in the boron containing heating element having a geometry that mirrors a geometry of a tip portion of a knife that provides the metal work piece, wherein the tip portion of the knife extends into the notch when the knife is being housed by the body portion of the assembly.

14. The boriding treatment apparatus of claim 1, wherein the boron containing heating element is comprised of boron carbide having a composition of $B_nC$, wherein "n" ranges from 4 to 10.

15. The boriding treatment apparatus of claim 1, wherein the boron containing heating element has a boron concentration ranging from 75 wt. % to 95 wt. %.

16. The boriding treatment apparatus of claim 1, wherein the boron containing heating element has a composition that includes a combined boron and carbon (B+C) content ranging from 93 wt. % to 99 wt. %, a boron oxide ($B_2O_3$) content of 1.0 wt. % or less, an iron (Fe) content of less than 0.5 wt. % and a silicon (Si) content of less than 0.5 wt. %.

17. The boriding treatment apparatus of claim 1, wherein the porosity is equal to 10% or greater of the boron containing solid form by volume.

18. The boriding treatment apparatus of claim 1, wherein the porosity of the boron containing solid form ranges from 20% to 80% by volume.

19. The boriding treatment apparatus of claim 1 further comprising another heating element in additional to the boron containing heating element for heating the reactor chamber, wherein said another heating element is selected from the group consisting of a convection heater, a heat lamp, a conductive heater, a microwave heater, a resistive heater, an inductive heater, an RF heater, a chemical reaction heater (CRH) and a combination thereof.

* * * * *